(12) United States Patent
Huang et al.

(10) Patent No.: US 10,720,516 B2
(45) Date of Patent: Jul. 21, 2020

(54) GATE STACK STRUCTURE AND METHOD FOR FORMING THE SAME

(71) Applicant: Taiwan Semiconductor Manufacturing Company, Ltd., Hsinchu (TW)

(72) Inventors: Ming-Chi Huang, Zhubei (TW); Ying-Liang Chuang, Zhubei (TW); Ming-Hsi Yeh, Hsinchu (TW); Kuo-Bin Huang, Jhubei (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 15/991,761

(22) Filed: May 29, 2018

(65) Prior Publication Data
US 2019/0006487 A1 Jan. 3, 2019

Related U.S. Application Data

(60) Provisional application No. 62/527,938, filed on Jun. 30, 2017.

(51) Int. Cl.
| | |
|---|---|
| *H01L 29/66* | (2006.01) |
| *H01L 29/78* | (2006.01) |
| *H01L 29/06* | (2006.01) |
| *H01L 21/02* | (2006.01) |
| *H01L 21/8234* | (2006.01) |
| *H01L 21/3115* | (2006.01) |

(Continued)

(52) U.S. Cl.
CPC ...... *H01L 29/6681* (2013.01); *H01L 21/0228* (2013.01); *H01L 21/02057* (2013.01); *H01L 21/02068* (2013.01); *H01L 21/02192* (2013.01); *H01L 21/02274* (2013.01); *H01L 21/02321* (2013.01); *H01L 21/2855* (2013.01); *H01L 21/28556* (2013.01); *H01L 21/3115* (2013.01); *H01L 21/31111* (2013.01); *H01L 21/823431* (2013.01); *H01L 29/0649* (2013.01); *H01L 29/0847* (2013.01); *H01L 29/4966* (2013.01); *H01L 29/66545* (2013.01); *H01L 29/66636* (2013.01); *H01L 29/785* (2013.01); *H01L 29/165* (2013.01); *H01L 29/517* (2013.01)

(58) Field of Classification Search
CPC ....... H01L 21/02192; H01L 21/823462; H01L 21/225; H01L 21/02181
See application file for complete search history.

(56) References Cited

U.S. PATENT DOCUMENTS

| | | | | |
|---|---|---|---|---|
| 2010/0327373 | A1* | 12/2010 | Carter | H01L 21/28088 257/392 |
| 2011/0081753 | A1* | 4/2011 | Yamanari | H01L 21/28088 438/216 |
| 2013/0299922 | A1* | 11/2013 | Choi | H01L 21/82345 257/412 |

FOREIGN PATENT DOCUMENTS

WO WO2011/148435 * 12/2011 ..... H01L 21/823842

* cited by examiner

*Primary Examiner* — Jesse Y Miyoshi
(74) *Attorney, Agent, or Firm* — Slater Matsil, LLP

(57) ABSTRACT

Embodiments of the present disclosure provide a method of cleaning a lanthanum containing substrate without formation of undesired lanthanum compounds during processing. In one embodiment, the cleaning method includes treating the lanthanum containing substrate with an acidic solution prior to cleaning the lanthanum containing substrate with a HF solution. The cleaning method permits using lanthanum (Continued)

doped high-k dielectric layer to modulate effective work function of the gate stack, thus, improving device performance.

20 Claims, 25 Drawing Sheets

(51) Int. Cl.
*H01L 21/311* (2006.01)
*H01L 29/51* (2006.01)
*H01L 21/285* (2006.01)
*H01L 29/49* (2006.01)
*H01L 29/08* (2006.01)
*H01L 29/165* (2006.01)

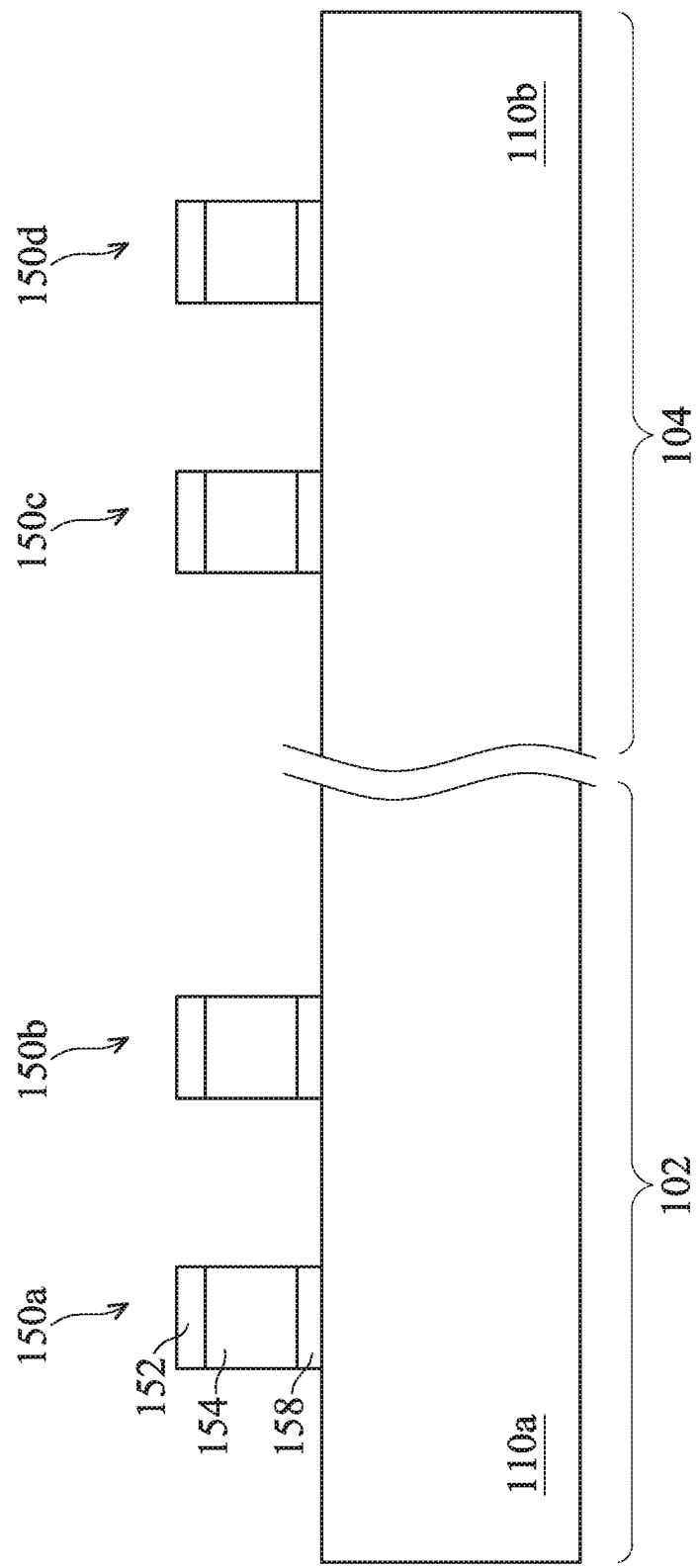

GATE STACK STRUCTURE AND METHOD FOR FORMING THE SAME

CROSS-REFERENCE TO RELATED APPLICATIONS

This application claims priority to U.S. Provisional Patent Application No. 62/527,938, filed on Jun. 30, 2017, which herein is incorporated by reference.

BACKGROUND

The semiconductor integrated circuit (IC) industry has experienced rapid growth. Technological advances in IC materials and design have produced generations of ICs where each generation has smaller and more complex circuits than the previous generation. However, these advances have increased the complexity of processing and manufacturing ICs and, for these advances to be realized, similar developments in IC processing and manufacturing are needed. When a semiconductor device such as a fin field-effect transistor (FinFET) is scaled down through various technology nodes, several strategies have been employed to improve device performance, such as using high-k dielectric materials and metal gate electrode structures.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
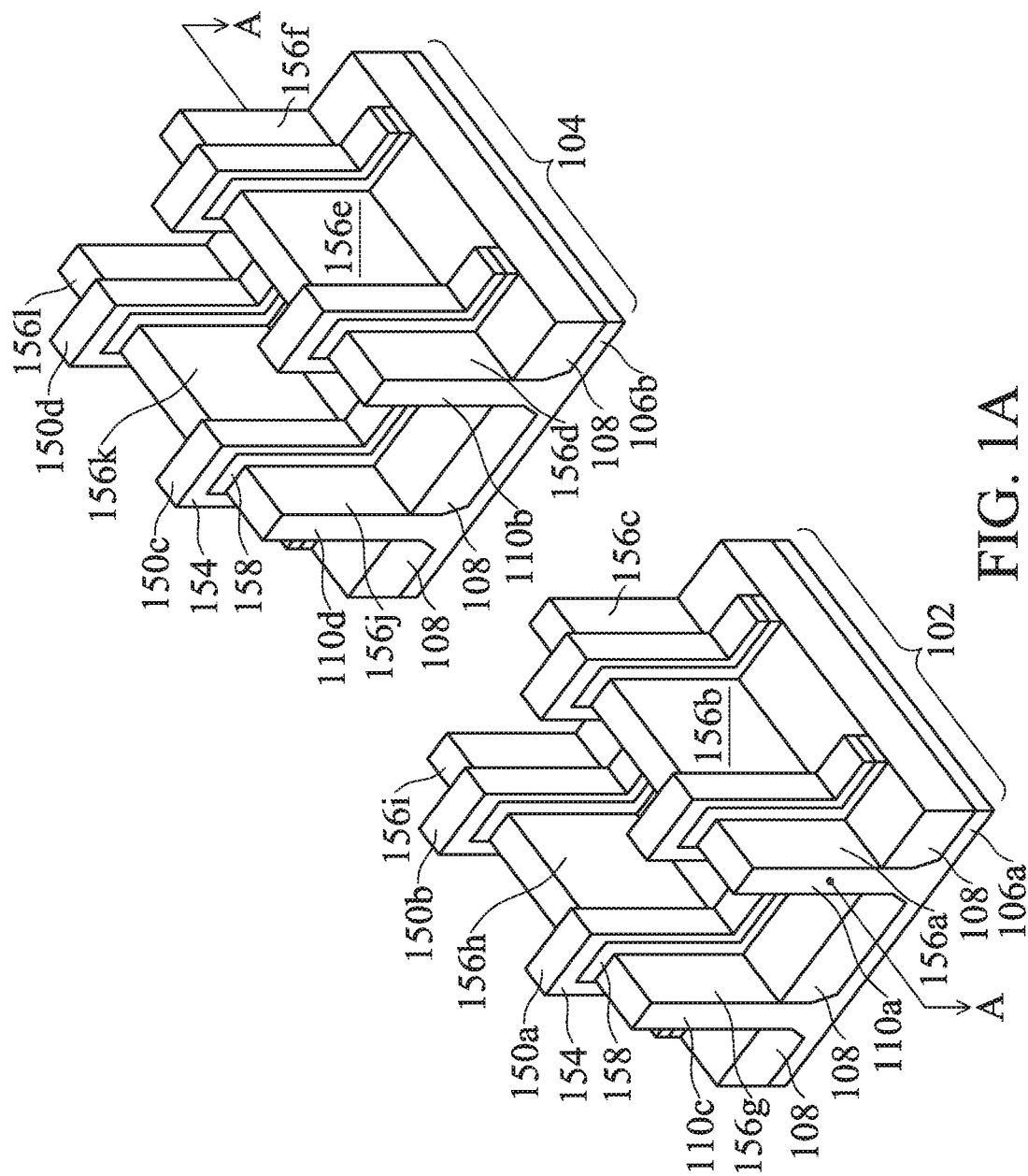
FIG. 1A is a three-dimensional view of an example of a device in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments of the present disclosure relate to a metal gate structure including a lanthanum containing layer and a method for forming the metal gate structure. Particularly, embodiments of the present disclosure provide a metal gate structure including a lanthanum doped high-k dielectric layer. Doping lanthanum in a high-k dielectric layer modulates an effective work function of the gate stack, thus, improving device performance.

Lanthanum may react with halogen elements in a subsequent cleaning process of forming the gate stack, causing formation of undesirable lanthanum halogen compounds. For example, when cleaning a substrate having a lanthanum containing layer using a hydrofluoric acid (HF) solution, the lanthanum on the substrate may react with fluorine in the HF solution to form lanthanum trifluoride ($LaF_3$). Lanthanum trifluoride does not generally dissolve in a typical cleaning solution and can remain on the substrate surface as residue causing defects or otherwise negatively affect the performance of the devices.

Embodiments of the present disclosure provide a method of cleaning a lanthanum containing substrate without formation of undesired lanthanum compounds during processing. In an embodiment, the cleaning method includes treating the lanthanum containing substrate with an acidic solution prior to cleaning the lanthanum containing substrate with an HF solution. Particularly, treating the lanthanum containing substrate with an acidic solution can use an acidic solution having a PH value between about 5.0 and about 7.0. In an embodiment, the acidic solution is a solution of carbon dioxide dissolved in deionized water. In an embodiment, the treatment with acidic solution and subsequent cleaning process may be performed in the same tool, such as a spin-rinse-dry tool.

FIG. 1A schematically illustrates a device 100 in a three-dimensional view. Other aspects not illustrated in or described with respect to FIG. 1A may become apparent from the following figures and description. The device 100 may be part of an IC, such as a microprocessor, memory cell (such as static random-access memory (SRAM)), and/or other integrated circuits. In some embodiments, the device 100 includes P-type FinFET structures 102 formed in an N-doped region 106a and N-type FinFET structures 104 formed in a P-doped region 106b. One or both of the N-doped region 106a and P-doped region 106b may be a doped well formed by implantation into a semiconductor substrate. For example, the semiconductor substrate can be a P-type doped substrate, a part of which forms the P-doped region 106b, and the N-doped region 106a may be an N-doped well formed by implanting N-type dopants into the P-type doped substrate.

The semiconductor substrate may be or include a bulk semiconductor substrate, a semiconductor-on-insulator (SOI) substrate, or the like, which may be doped (e.g., with a P-type or an N-type dopant) or undoped. Generally, an SOI substrate comprises a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the semiconductor substrate may include silicon (Si); germanium (Ge); a compound semiconductor including silicon carbide, gallium arsenic, gallium phosphide, indium phosphide, indium arsenide, or indium antimonide; an alloy semiconductor including SiGe, GaAsP, AlInAs, AlGaAs, GaInAs, GaInP, or GaInAsP; or a combination thereof.

Fins 110a and 110b are formed in the N-doped region 106a and fins 110c and 110d are formed in the P-doped region 106b using a patterned mask, such as a hard mark. For example, one or more mask layers are deposited over the semiconductor substrate in the N-doped region 106a and the P-doped region 106b and then patterned into a fin mask. In some examples, the one or more mask layers may include or be silicon nitride, silicon oxynitride, silicon carbide, silicon carbon nitride, the like, or a combination thereof, and may be deposited by chemical vapor deposition (CVD), physical vapor deposition (PVD), atomic layer deposition (ALD), or another deposition technique. The one or more mask layers may be patterned using photolithography. For example, a photo resist can be formed on the one or more mask layers, such as by using spin-on coating, and patterned by exposing the photo resist to light using an appropriate photomask. Exposed or unexposed portions of the photo resist may then be removed depending on whether a positive or negative resist is used. The pattern of the photoresist may then be transferred to the one or more mask layers, such as by using a suitable etch process, which forms the fin mask. The etch process may include a reactive ion etch (RIE), neutral beam etch (NBE), the like, or a combination thereof. The etching may be anisotropic. Subsequently, the photo resist is removed in an ashing process or wet strip process. The semiconductor substrate in the N-doped region 106a and the P-doped region 106b is then etched to form fins 110a, 110b, 110c, 110d such that the fins 110a, 110b, 110c, 110d protrude from the N-doped region 106a and the P-doped region 106b. The etch process may include a RIE, NBE, the like, or a combination thereof. The etching may be anisotropic.

After formation of the fins 110a, 110b, 110c, 110d, an insulating material may be deposited in the trenches between the fins 110a, 110b, 110c, 110d to form isolation regions 108. The isolation regions 108 may include or be an insulating material such as an oxide (such as silicon oxide), a nitride, the like, or a combination thereof, and the insulating material may be formed by a high density plasma CVD (HDP-CVD), a flowable CVD (FCVD) (e.g., a CVD-based material deposition in a remote plasma system and post curing to make it convert to another material, such as an oxide), the like, or a combination thereof. Other insulating materials formed by any acceptable process may be used. In the illustrated embodiment, the isolation regions 108 include silicon oxide that is formed by a FCVD process. A planarization process, such as a chemical mechanical polish (CMP), may remove any excess insulating material and any remaining fin mask to form top surfaces of the insulating material and top surfaces of the fins 110a, 110b, 110c, 110d to be coplanar. The insulating material may then be recessed to form the isolation regions 108. The insulating material is recessed such that the fins 110a, 110b, 110c, 110d protrude from between neighboring isolation regions 108, which may, at least in part, thereby delineate the fins 110a, 110b, 110c, 110d as active areas in the N-doped region 106a and P-doped region 106b. The insulating material may be recessed using an acceptable etching process, such as one that is selective to the material of the insulating material. For example, a chemical oxide removal using a CERTAS® etch or an Applied Materials SICONI® tool or dilute hydrofluoric (dHF) acid may be used. Further, top surfaces of the isolation regions 108 may have a flat surface as illustrated, a convex surface, a concave surface (such as dishing), or a combination thereof, which may result from an etch process.

After formation of the isolation regions 108, dummy gate stacks 150a, 150b, 150c, 150d are then formed on the fins 110a, 110b, 110c, 110d. Each dummy gate stack 150a, 150b, 150c, 150d includes an interfacial dielectric 158, a dummy gate 154, and a mask 152 (shown in FIG. 1B). The interfacial dielectric 158, dummy gate 154, and mask 152 may be formed by sequentially depositing respective layers and patterning those layers. For example, a layer for the interfacial dielectric 158 may include or be silicon oxide, silicon nitride, the like, or multilayers thereof, and may be thermally grown or deposited, such as by plasma-enhanced CVD (PECVD), ALD, or another deposition technique. A layer for the dummy gate 154 may include or be silicon (e.g., polysilicon) or another material deposited by CVD, PVD, or another deposition technique. A layer for the mask 152 may include or be silicon nitride, silicon oxynitride, silicon carbon nitride, the like, or a combination thereof, deposited by CVD, PVD, ALD, or another deposition technique. The layers for the mask 152, dummy gate 154, and interfacial dielectric 158 may then be patterned, for example, using photolithography and one or more etch processes.

The P-type FinFET structure 102 includes fins 110a and 110c in the N-doped region 106a. Each fin 110a, 110c protrudes above and from between neighboring isolation regions 108. The dummy gate stacks 150a, 150b, later replaced by metal gate stacks, are along sidewalls and over top surfaces of the fins 110a and 110c. Source/drain regions 156a-c, 156g-i are disposed in respective regions of the fins 110a and 110c. Source/drain regions 156a and 156b are disposed in opposing regions of the fin 110a with respect to the dummy gate stack 150a. Source/drain regions 156b and 156c are disposed in opposing regions of the fin 110a with respect to the dummy gate stack 150b. Source/drain regions 156g and 156h are disposed in opposing regions of the fin 110c with respect to the dummy gate stack 150a. Source/drain regions 156h and 156i are disposed in opposing regions of the fin 110c with respect to the dummy gate stack 150b.

In some examples, four transistors may be implemented in the P-type FinFET structure 102 by: (1) source/drain regions 156a and 156b, and a gate stack in place of the dummy gate stack 150a; (2) source/drain regions 156b and 156c, and a gate stack in place of the dummy gate stack 150b; (3) source/drain regions 156g and 156h, and a gate stack in place of the dummy gate stack 150a; and (4) source/drain regions 156h and 156i, and a gate stack in place of the dummy gate stack 150b. As indicated, some source/drain regions may be shared between various transistors, and other source/drain regions that are not illustrated as being shared may be shared with neighboring transistors that are not illustrated, for example. In some examples, various ones of the source/drain regions may be connected or coupled together such that FinFETs are implemented as two functional transistors. For example, if neighboring (e.g., as opposed to opposing) source/drain regions 156a-c and 156g-i are electrically connected, such as through coalescing the regions by epitaxial growth (e.g., source/drain regions 156a and 156g being coalesced, source/drain regions 156b and 156h being coalesced, etc.), two functional transistors may be implemented. Other configurations in other examples may implement other numbers of functional transistors.

The N-type FinFET structure 104 includes fins 110b and 110d on the P-doped region 106b. Each fin nob, nod protrudes above and from between neighboring isolation regions 108. The dummy gate stacks 150c, 150d, later replaced by metal gate stacks, are along sidewalls and over top surfaces of the fins 110b and 110d. Source/drain regions 156d-f, 156j-l are disposed in respective regions of the fins 110b and 110d. Source/drain regions 156d and 156e are disposed in opposing regions of the fin 110b with respect to the dummy gate stack 150c. Source/drain regions 156e and 156f are disposed in opposing regions of the fin 110b with respect to the dummy gate stack 150d. Source/drain regions 156j and 156k are disposed in opposing regions of the fin 110d with respect to the dummy gate stack 150c. Source/drain regions 156k and 156l are disposed in opposing regions of the fin nod with respect to the dummy gate stack 150d.

In some examples, four transistors may be implemented in the N-type FinFET structure 104 by: (1) source/drain regions 156d and 156e, and a gate stack in place of the dummy gate stack 150c; (2) source/drain regions 156e and 156f, and a gate stack in place of the dummy gate stack 150d; (3) source/drain regions 156j and 156k, and a gate stack in place of the dummy gate stack 150c; and (4) source/drain regions 156k and 156l, and a gate stack in place of the dummy gate stack 150d.

Figure 1C:
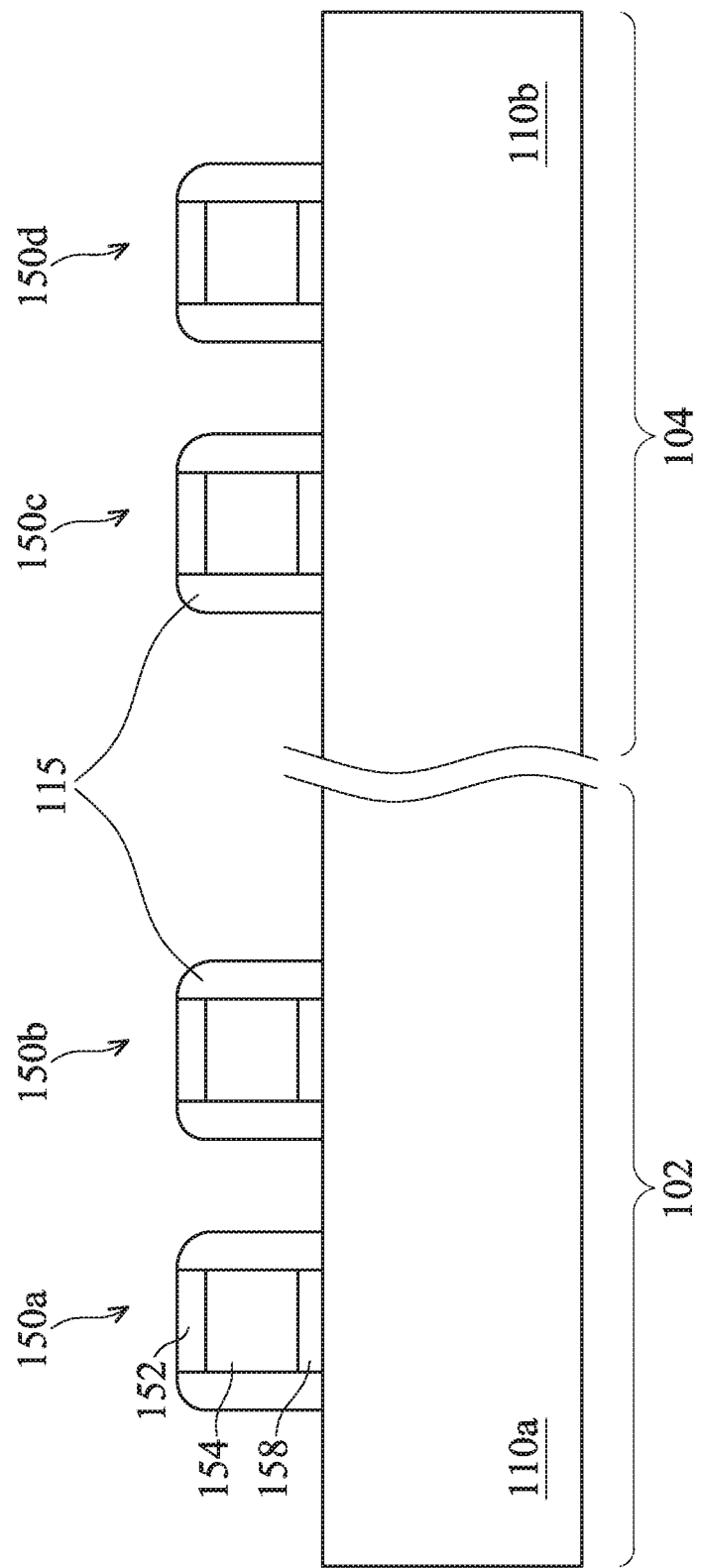
FIGS. 1B-1T are schematic cross sectional views of a device being processed according to some embodiments of the present disclosure.

FIG. 1A further illustrates reference cross-sections that are used in later figures. Cross-section A-A is in a plane along, e.g., channels in the fins 110a, 110b between opposing source/drain regions 156a-f. FIGS. 1B-1T are schematic cross sectional views of the device 100 along the A-A plane. Particularly, FIGS. 1B-1T schematically illustrates the device 100 at various stages for forming metal gate stacks according to a method 200 shown in FIGS. 2A-2C.

In operation 205 of the method 200, the device 100 having the p-type FinFET structure 102 and n-type FinFET structure 104 with the dummy gate stacks 150a-d as shown in FIG. 1A is provided.

In operation 210 of the method 200, the dummy gate stacks 150a-d are removed to created trenches 120a-120d for forming replacement metal gate stacks. FIGS. 1B-1I schematically illustrate a process for removing the dummy gate stacks 150a-150d according an embodiment of the present disclosure.

FIG. 1B is a cross-sectional view of the device 100 of FIG. 1A along the A-A plane. FIG. 1B shows the mask 152 over the dummy gate 154. The gate spacers 115 are then formed along sidewalls of the dummy gate stacks 150a-150d (e.g., sidewalls of the interfacial dielectric 158, dummy gate 154, and mask 152) as shown in FIG. 1C. For example, the gate spacers 115 may be formed by conformally depositing one or more layers for gate spacers 115 and anisotropically etching the one or more layers. The one or more layers for the gate spacers 115 may include or be silicon nitride, silicon oxynitride, silicon carbon nitride, the like, multi-layers thereof, or a combination thereof, and the etch process can include a RIE, NBE, or another etching process.

Figure 1D:
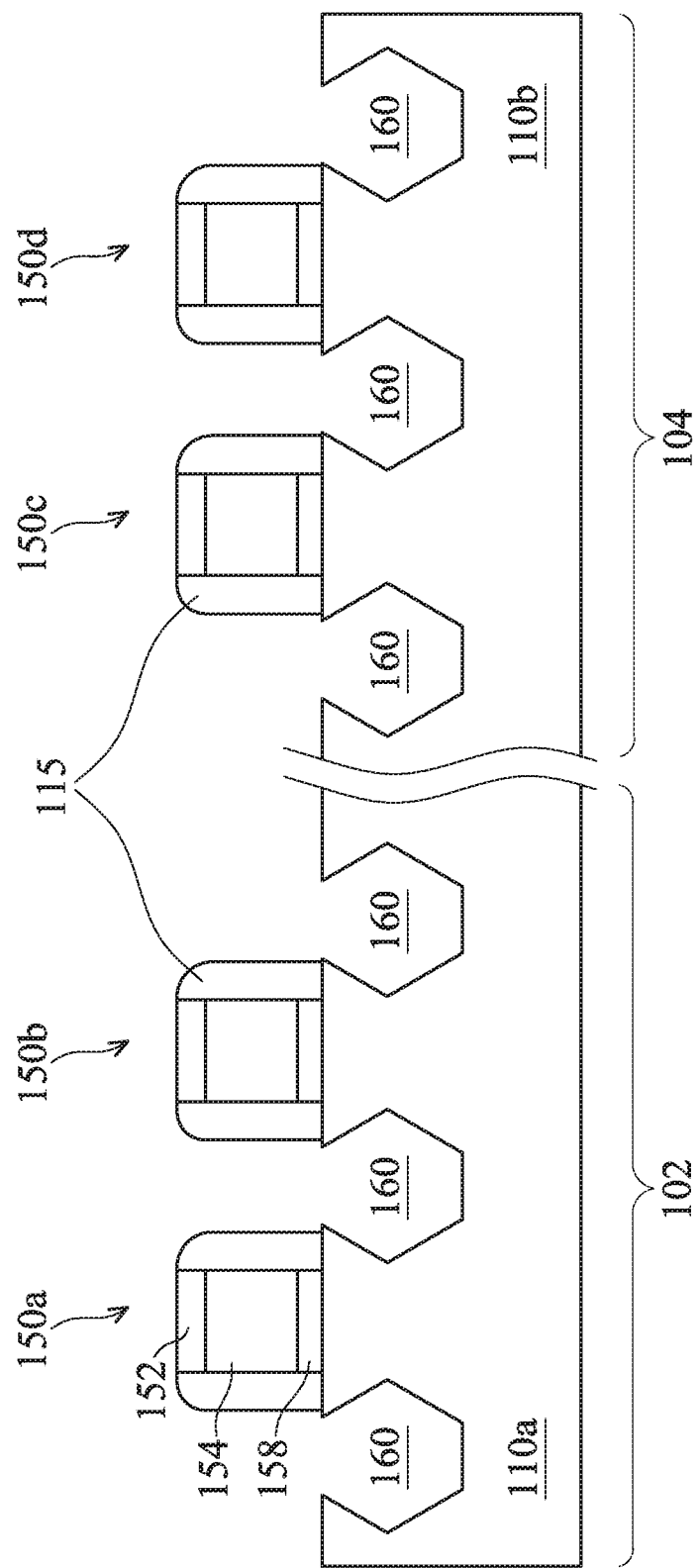

FIG. 1D schematically illustrates the formation of recesses 160 for source/drain regions. The recesses 160 are formed in the fins 110a, 110b on opposing sides of the dummy gate stacks 150a-d. Recessing can be implemented by an etch process. The etch process can be isotropic or anisotropic, or further, may be selective with respect to one or more crystalline planes of the semiconductor substrate on which the device 100 is formed. The recesses 160 can have various cross-sectional profiles based on the etch process implemented. The etch process may be a dry etch, such as a RIE, NBE, or the like, or a wet etch, such as using tetramethyalammonium hydroxide (TMAH), ammonium hydroxide ($NH_4OH$), or another etchant.

Epitaxy source/drain regions 112a, 112b are then formed in the recesses 160. The epitaxy source/drain regions 112a, 112b may include or be silicon germanium ($Si_xGe_{1-x}$, where x can be between approximately 0 and 100), silicon carbide, silicon phosphorus, pure or substantially pure germanium, a III-V compound semiconductor, a II-VI compound semiconductor, or the like. For example, materials for forming a III-V compound semiconductor include InAs, AlAs, GaAs, InP, GaN, InGaAs, InAlAs, GaSb, AlSb, AlP, GaP, and the like. The epitaxy source/drain regions 112a, 112b may be formed in the recesses 160 by epitaxially growing a material in the recesses 160, such as by metal-organic CVD (MOCVD), molecular beam epitaxy (MBE), liquid phase epitaxy (LPE), vapor phase epitaxy (VPE), selective epitaxial growth (SEG), the like, or a combination thereof. Due to blocking by the isolation regions 108, epitaxy source/drain regions 112a, 112b are first grown vertically in recesses 160, during which time the epitaxy source/drain regions 112a, 112b do not grow horizontally. After the recesses 160 are fully filled, the epitaxy source/drain regions 112a, 112b may grow both vertically and horizontally to form facets, which may correspond to crystalline planes of the semiconductor substrate.

Different materials are used for epitaxy source/drain regions 112a and 112b because the epitaxy source/drain regions 112a are for p-type devices while the epitaxy source/drain regions 112b are for n-type devices. In some embodiments, appropriate masking during the recessing and epitaxial growth may permit different materials to be used in different devices.

Figure 1E:
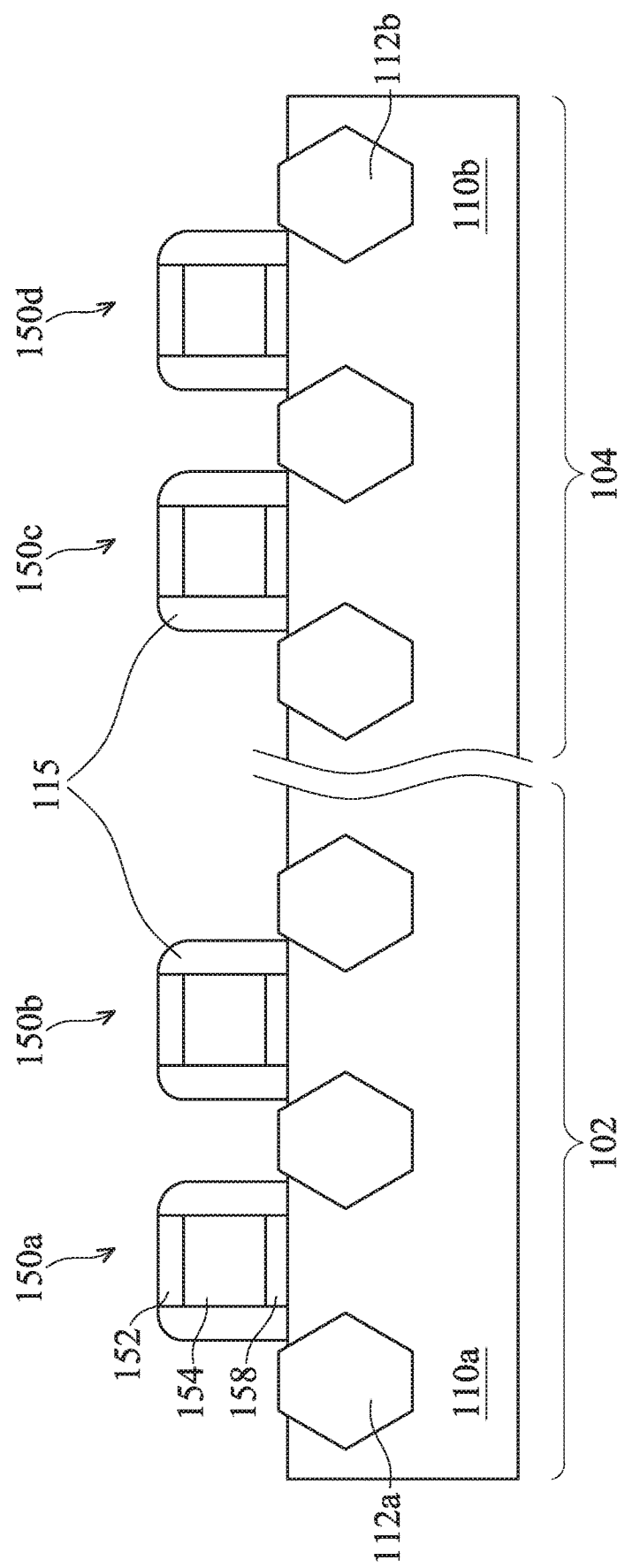

A person having ordinary skill in the art will also readily understand that the recessing and epitaxial growth of FIGS. 1D and 1E may be omitted, and that source/drain regions may be formed by implanting dopants into the fins 110a, 110b. In some examples where epitaxy source/drain regions 112a, 112b are implemented, the epitaxy source/drain regions 112a, 112b may also be doped, such as by in-situ doping during epitaxial growth and/or by implanting dopants into the epitaxy source/drain regions 112a, 112b after epitaxial growth. Example dopants can include or be, for example, boron for the epitaxy source/drain regions 112a to form p-type devices and phosphorus or arsenic for the epitaxy source/drain regions 112b to form n-type devices.

Figure 1F:
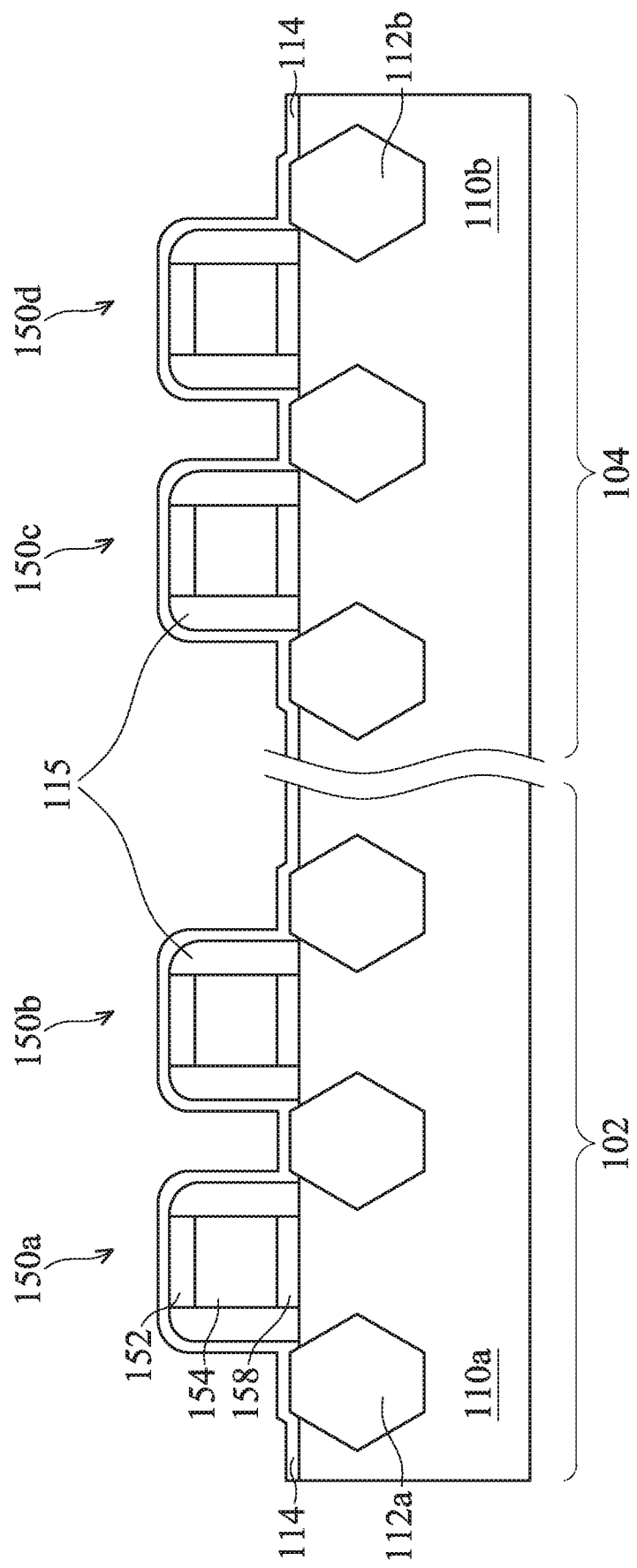

As shown in FIG. 1F, an etch stop layer (ESL) 114 is formed. The etch stop layer 114 can provide a mechanism to stop an etching process when forming, e.g., contacts. An etch stop layer 114 may be formed of a dielectric material having a different etch selectivity from adjacent layers, for example, a subsequent interlayer dielectric. The etch stop layer 114 may be conformally deposited over the epitaxy source/drain regions 112a, 112b, dummy gate stacks 150a-d, gate spacers 115, and isolation regions 108. The etch stop layer 114 may comprise or be silicon nitride, silicon carbon nitride, silicon carbon oxide, carbon nitride, the like, or a combination thereof, and may be deposited by CVD, PECVD, ALD, or another deposition technique.

Figure 1G:
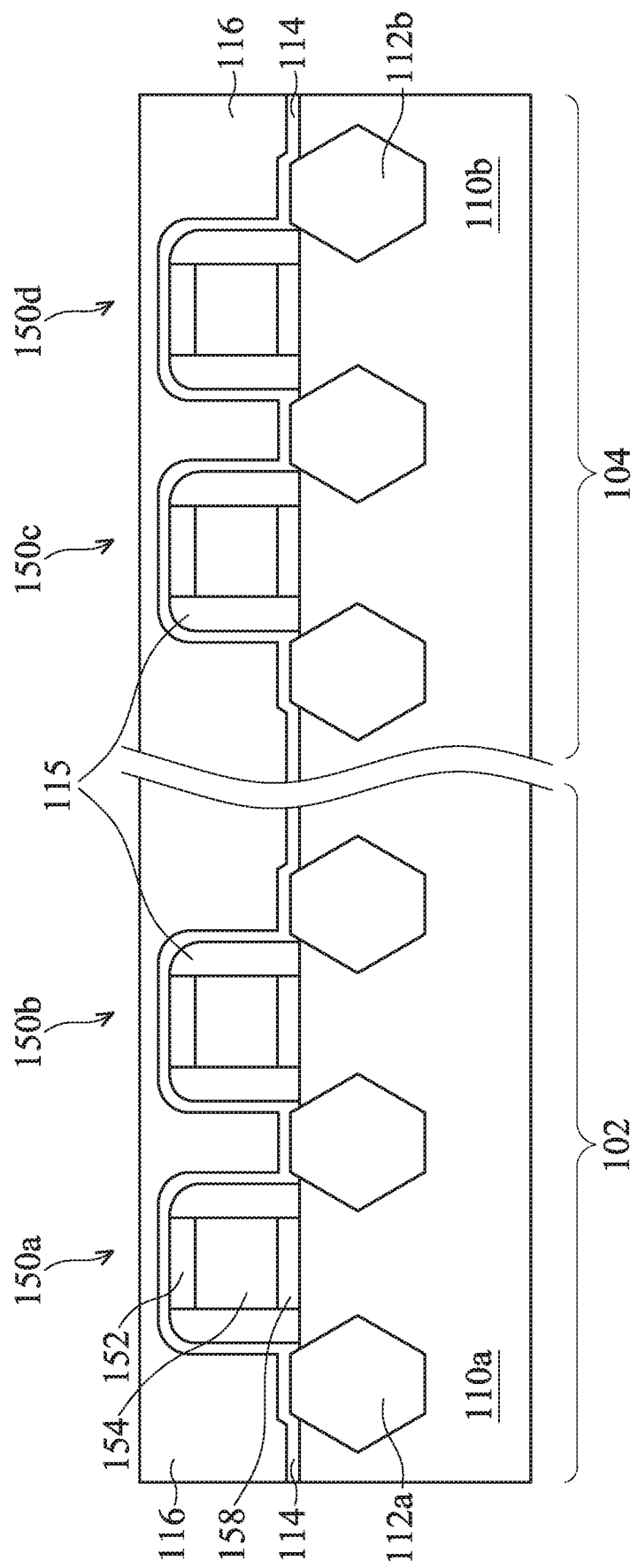

As shown in FIG. 1G, an interlayer dielectric layer 116 is formed over the etch stop layer 114. The interlayer dielectric layer 116 may comprise or be silicon dioxide, a low-k dielectric material (e.g., a material having a dielectric constant lower than silicon dioxide), such as silicon oxynitride, phosphosilicate glass (PSG), borosilicate glass (BSG), borophosphosilicate glass (BPSG), undoped silicate glass (USG), fluorinated silicate glass (FSG), organosilicate glasses (OSG), $SiO_xC_y$, Spin-On-Glass, Spin-On-Polymers, silicon carbon material, a compound thereof, a composite thereof, the like, or a combination thereof. The interlayer dielectric layer 116 may be deposited by spin-on, CVD, FCVD, PECVD, PVD, or another deposition technique.

Figure 1H:
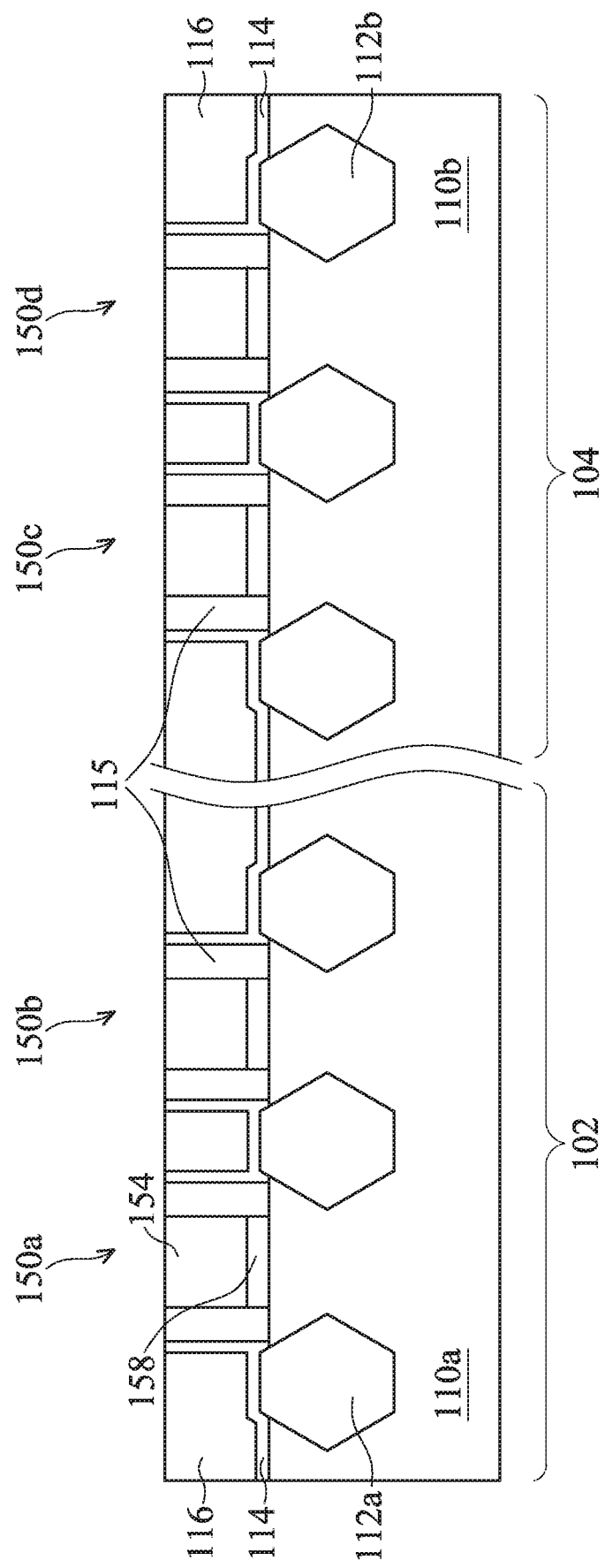

As shown in FIG. 1H, a planarization process, such as a CMP, may be performed to level the top surface of the one or more dielectric layers 116. In some embodiments, the CMP process may remove the mask 152 and upper portions of the gate spacers 115. As a result, top surfaces of the dummy gates 154 are exposed through the interlayer dielectric layer 116 and the etch stop layer 114.

Figure 1I:
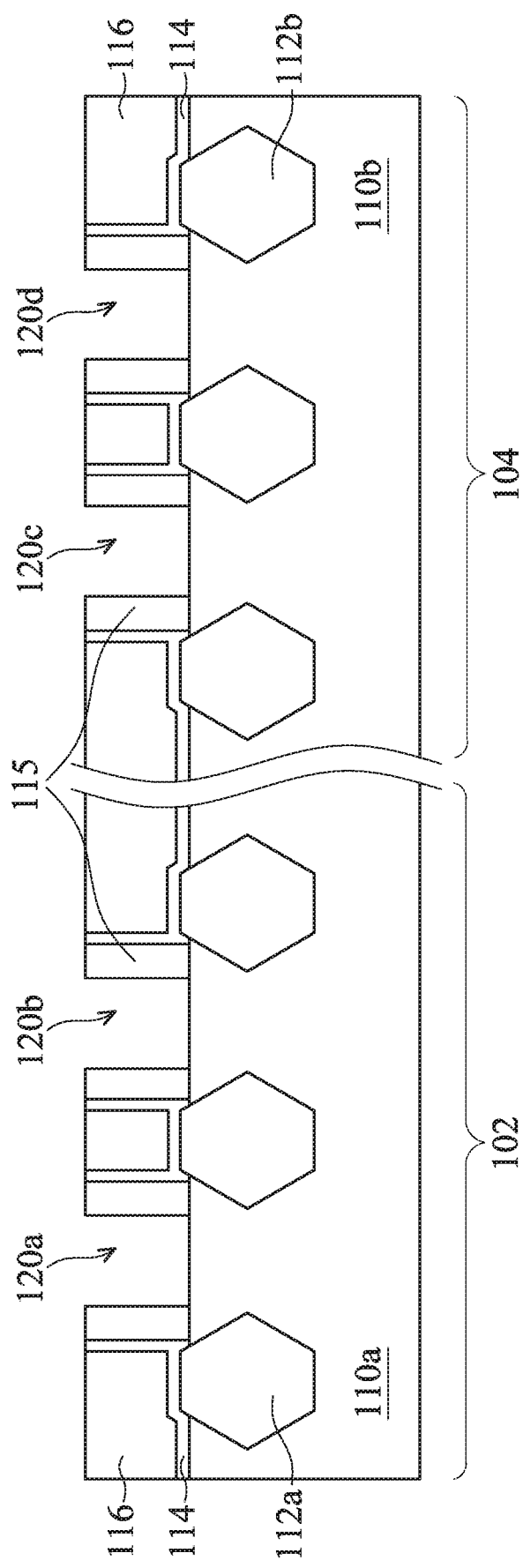

The dummy gate 154 and the interfacial dielectric 158 may be removed to form trenches 120a, 120b, 120c, 120d where replacement gate stacks are subsequently formed, as shown in FIG. 1I. The dummy gate 154 may be removed by an etch process, wherein the interfacial dielectric 158 act as etch stop layer. Subsequently, the interfacial dielectric 158 can be removed by a different etch process, for example, a RIE, NBE, a wet etch, or another suitable etch process.

Figure 1J:
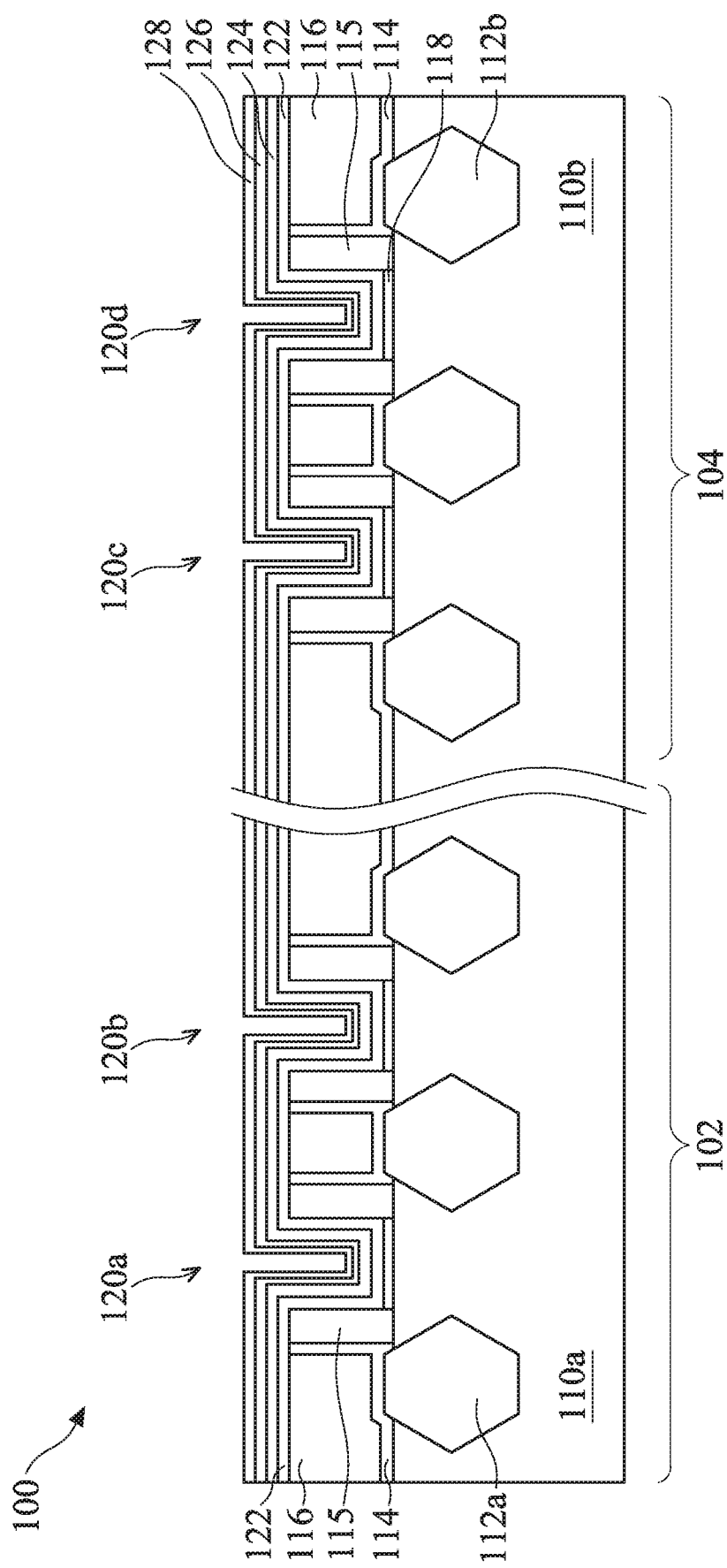

In operation 215, a high-k dielectric layer 122 is formed conformally over bottoms and sidewalls of the trenches 120a, 120b, 120c, 120d. In one embodiment, an interfacial layer 118 may be formed at the bottom of the trenches 120a-d prior to forming the high-k dielectric layer 122 as shown in FIG. 1J. The interfacial layer 118 may include or be silicon oxide, HfSiO or oxynitride formed by a proper technique, such as atomic layer deposition (ALD), CVD, thermal oxidation, PVD, or UV-ozone oxidation.

The high-k dielectric layer 122 may be formed by ALD, CVD, metal-organic CVD (MOCVD), physical vapor deposition (PVD), other suitable technique, or a combination thereof. In one embodiment, the high-k dielectric layer 122 is formed by a blanket deposition over the device 100. The high-k dielectric layer 122 may have a thickness in a range from about 15 angstroms to about 30 angstroms.

The high-k dielectric layer 122 includes one or more high-k dielectric materials, such as lanthanum oxide (LaO), aluminum oxide ($Al_2O_3$), zirconium oxide (ZrO), titanium oxide (TiO), tantalum oxide ($Ta_2O_5$), yttrium oxide ($Y_2O_3$), strontium titanate ($SrTiO_3$, or STO), barium titanate (Ba$TiO_3$, or BTO), barium zirconate ($BaZrO_3$), HfZrO, HfLaO, HfSiO, LaSiO, AlSiO, HfTaO, HfTiO, $(Ba,Sr)TiO_3$ (BST), $Si_xN_y$, silicon oxynitrides (SiON), or other suitable materials.

In an embodiment, the high-k dielectric layer 122 includes one of $HfO_2$, HfZrO, HfSiO, SiO, HfTaO, HfTiO, TiO, $Ta_2O_5$, which may be later doped with lanthanum. In one embodiment, the high-k dielectric layer 122 includes one or more hafnium oxides formed by an ALD process. For example, the high-k dielectric layer 122 may include hafnium oxide, hafnium silicon oxide, hafnium silicon oxynitride, hafnium tantalum oxide, hafnium titanium oxide, hafnium zirconium oxide, or a combination thereof. In one embodiment, the hafnium oxide layer may be formed by an ALD process using $HfCl_4$ and $H_2O$ as precursors. The $HfO_2$ film may have a thickness in a range from about 10 angstroms to about 20 angstroms.

In operation 220, a doping layer 124 is formed over the high-k dielectric layer 122. The doping layer 124 overlies the high-k dielectric layer 122 by a blanket deposition as shown in FIG. 1J. The doping layer 124 may be formed by ALD, CVD, MOCVD, PVD or other suitable methods. The doping layer 124 may be a layer of material including suitable elements to be doped in the high-k dielectric layer 122 to the tune the work function of the gate stack. In some embodiments, the doping layer 124 includes lanthanum (La), scandium (Sc), strontium oxide (SrO), or a combination thereof. In one embodiment, the doping layer 124 may be a lanthanum oxide ($LA_2O_3$) layer. The lanthanum oxide layer may be formed by an ALD process. In one embodiment, the doping layer 124 may have a thickness in a range from about 3 angstroms to about 6 angstroms. A subsequent annealing process allows lanthanum atoms in the doping layer 124 to be doped into the high-k dielectric layer 122 to tune work function of the gate stack.

In operation 225, a first cap layer 126 may be formed over the doping layer 124. In one embodiment, the first cap layer 126 includes an aluminum oxide layer formed by an ALD process. In some embodiments, the first cap layer 126 may include titanium nitride (TiN) or tantalum nitride (TaN). In one embodiment, the first cap layer 126 has a thickness in a range from 10 angstroms to 20 angstroms.

In operation 230, a second cap layer 128 may be formed over the first cap layer 126 as shown in FIG. 1J. The second cap layer 128 may include a TiN layer. In other embodiments, the second cap layer 128 may include tantalum nitride (TaN). The second cap layer 128 may be formed by an ALD process. In one embodiment, the second cap layer 128 has a thickness in a range from 10 angstroms to 20 angstroms. The first and second cap layers 126 and 128 are used to prevent impurities from entering the underlying layers during the subsequent processes. In some embodiments, only one of the first and second cap layers 126, 128 is used. In some embodiments, the first and second cap layers 126 and 128 are not used.

Figure 1K:
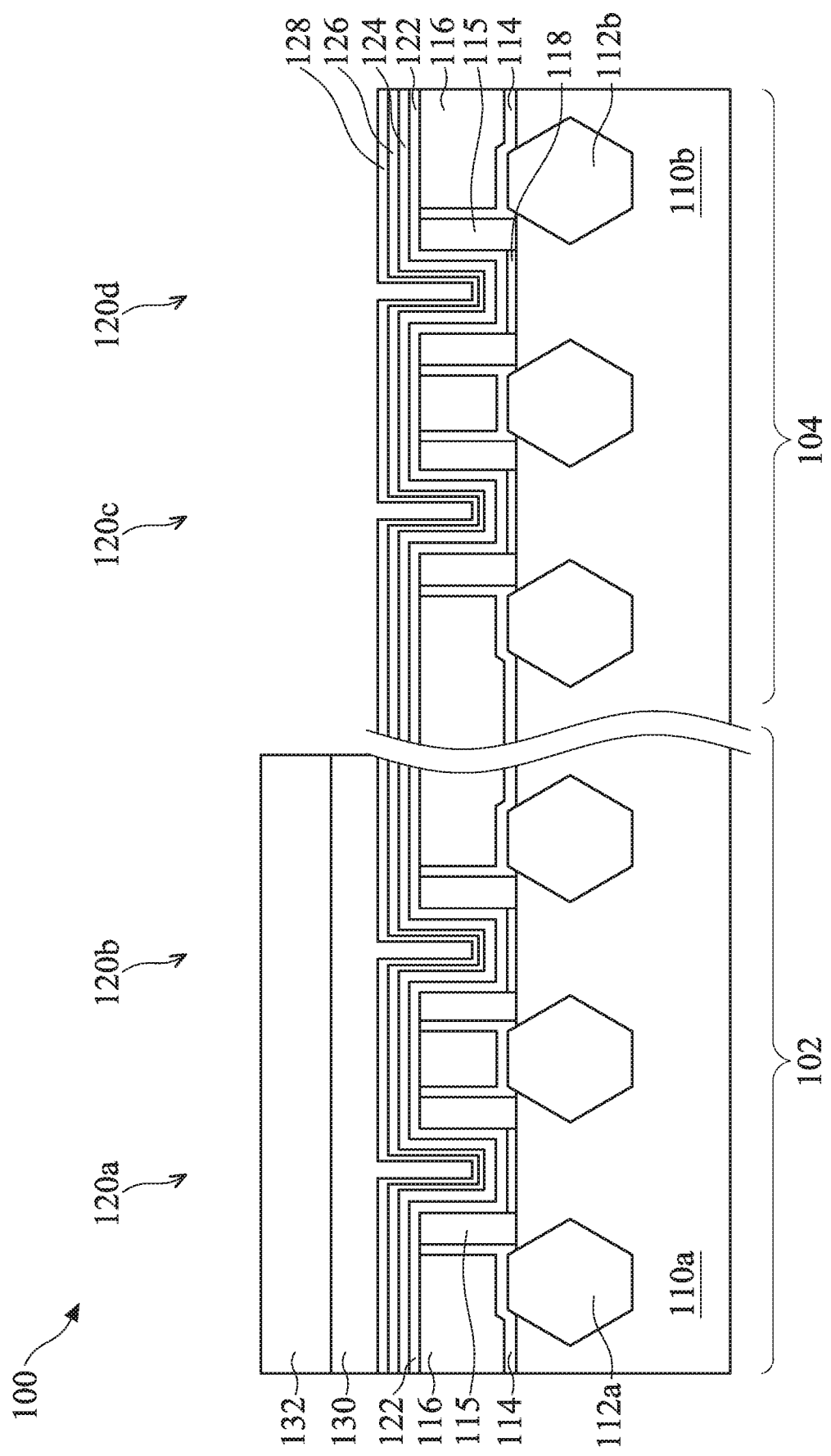

In operation 235, a photolithography process is performed to form patterned layers over the device 100. The patterned layers may include a bottom anti-reflective coating (BARC) layer 130 and a photoresist layer 132, as shown in FIG. 1K. The BARC layer 130 may be an organic material coated onto the substrate filling the trenches 120a, 120d, 120c, 120d and then removed from portions of the substrate after patterning, such as by using photolithography with the photoresist layer 132. In one embodiment, the patterned layers may expose certain regions, such as regions corresponding to the N-type FinFET structure 104 to allow processing over regions of the N-type FinFET structure 104 while leaving the remaining regions intact. It is noted that the patterned layers may be formed at other portion of the substrate, such as over the N-type FinFET structure 104.

Figure 1L:
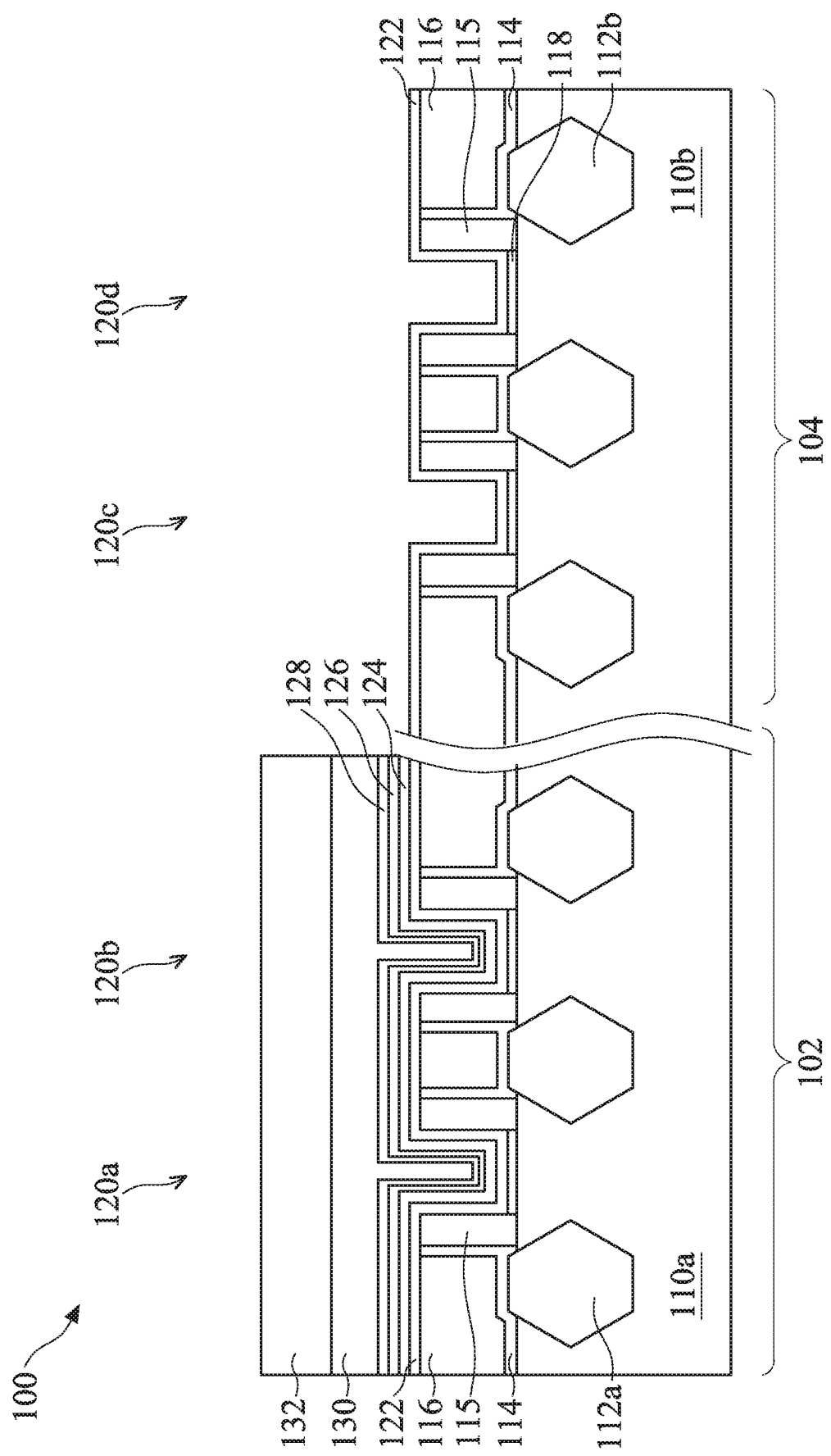

In operation 240, the doping layer 124, the first cap layer 126 if used, and the second cap layer 128 if used are removed from the device 100 from regions exposed by the patterned layers. In FIG. 1L, the doping layer 124, the first cap layer 126, and the second cap layer 128 are removed from the N-type FinFET structure 104.

The doping layer 124, first cap layer 126, and second cap layer 128 may be removed by an etch process. In one embodiment, operation 240 may be performed by a wet etch process. For example, the etching process may be performed by dipping, immersing, or soaking the substrate with or in an etching solution in a wet tank. The etching solution may be an alkaline, neutral or acid solution with a pH value in a predetermined range. Selection of the etching solution is based on the materials in the doping layer 124, first cap layer 126, and second cap layer 128. In one embodiment, one etching solution may be used to etch all three layers. In some embodiments, two or more etching solutions may be used to etch the second cap layer 128, first cap layer 126, and doping layer 124 sequentially. In one embodiment, the etching solution(s) may include a phosphoric acid (or orthophosphoric acid), a mixture of phosphoric acid with other components such as hydrogen peroxide ($H_2O_2$). Other etchants, such as hydrofluoric acid (HF), hydrochloric acid (HCl), and/or sulfuric acid ($H_2SO_4$), may also be utilized. In an example, the ratio of phosphoric acid in the deionized (DI) water of the etching solution is in a range from about 1:5 to about 1:50. These etchants may be utilized to maintain a desired level of pH value and/or to assist dissociation of the chemical compounds dissolved in the etching solution. In an example, the etching process may be maintained at a temperature in a range from about 20 to about 80 degrees Celsius. In some embodiments, operation 240 may be performed by an etch process, such as a dry etch process, such as a vapor or a plasma process.

Figure 1M:
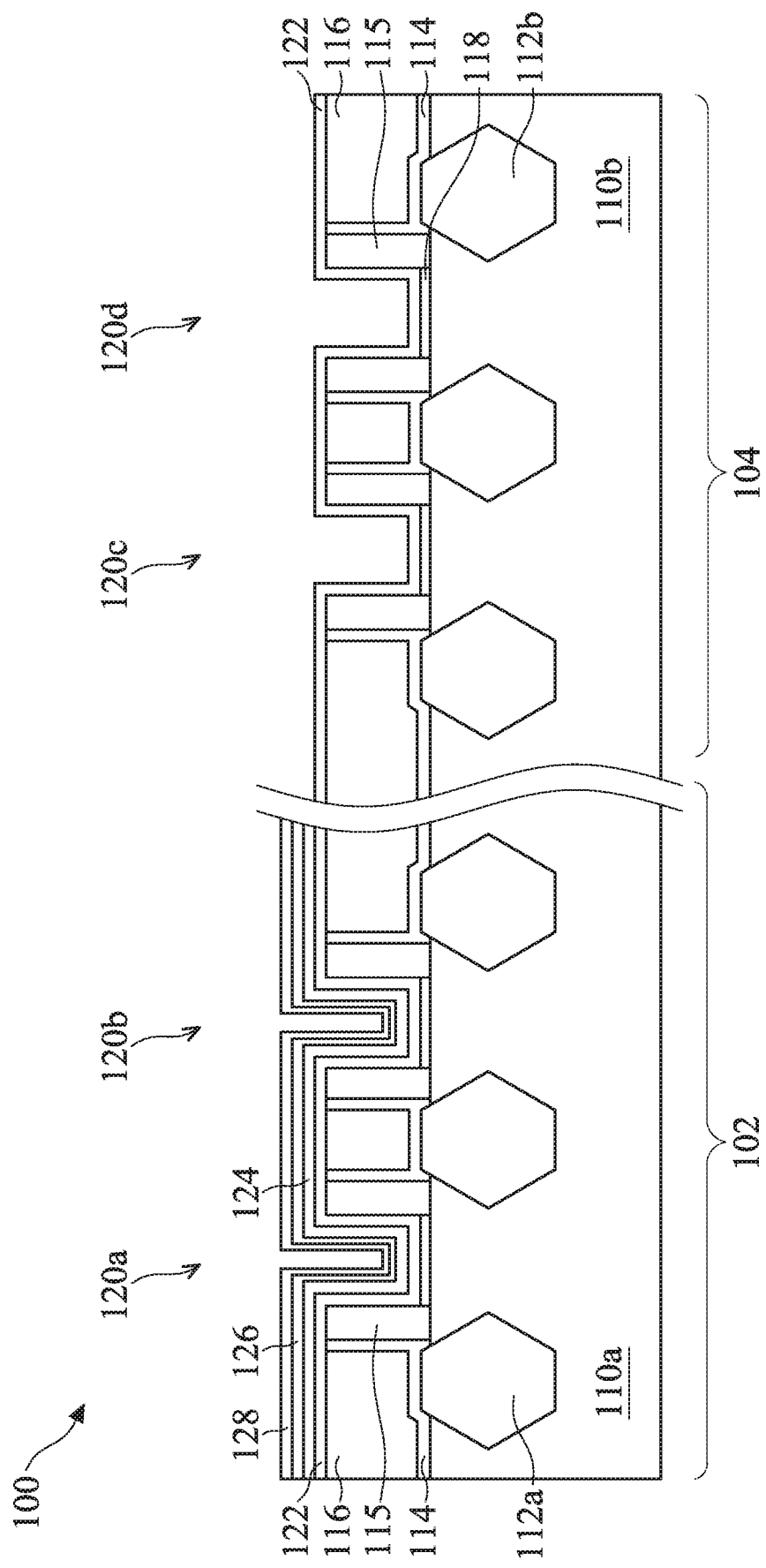

In operation 245, the BARC layer 130 and photoresist layer 132 are removed, for example, by an ashing process, as shown in FIG. 1M. For example, an ashing process using oxygen plasma may be used to remove the BARC layer 130 and photoresist layer 132.

Figure 1N:
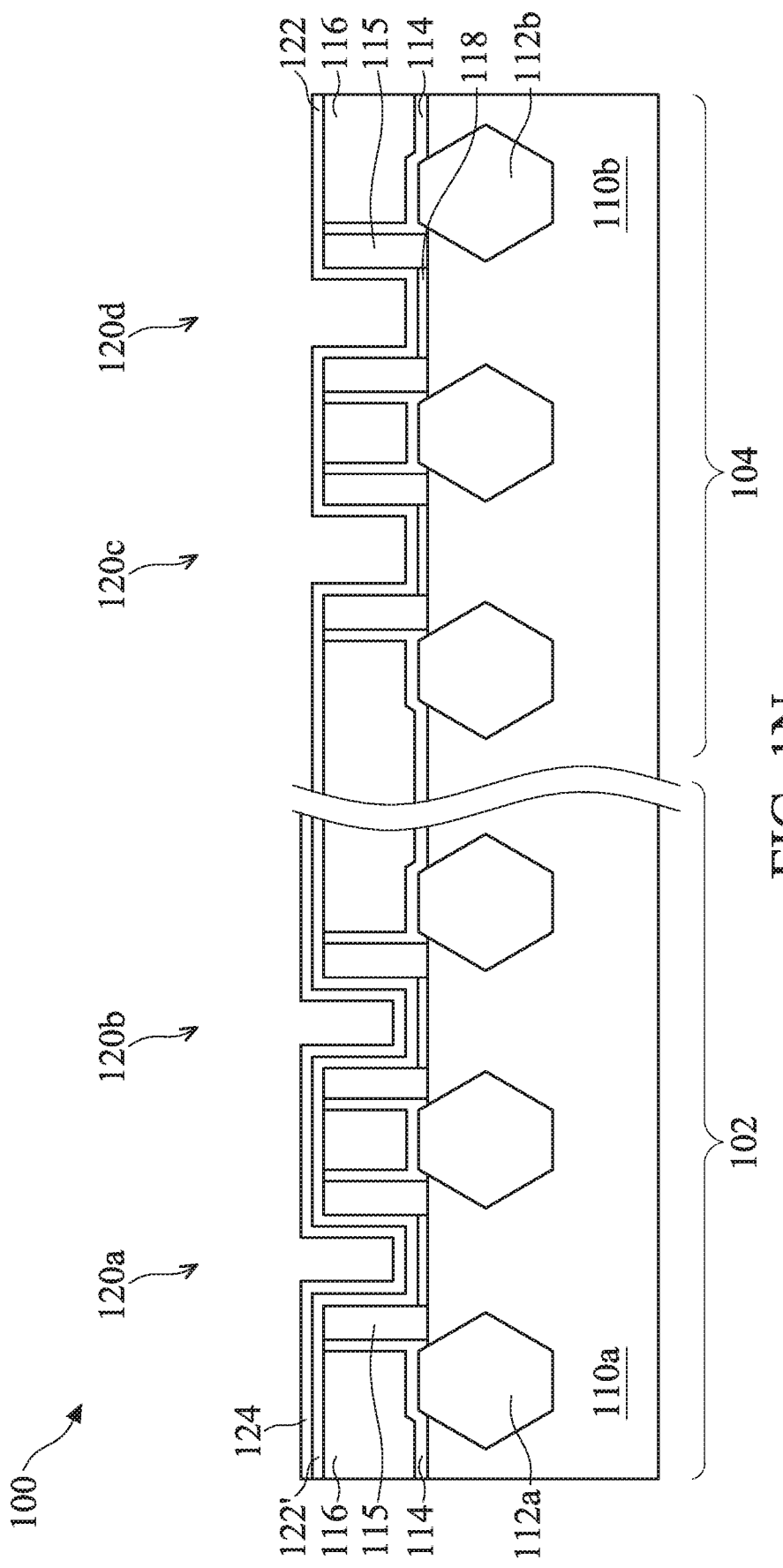
Figure 10:
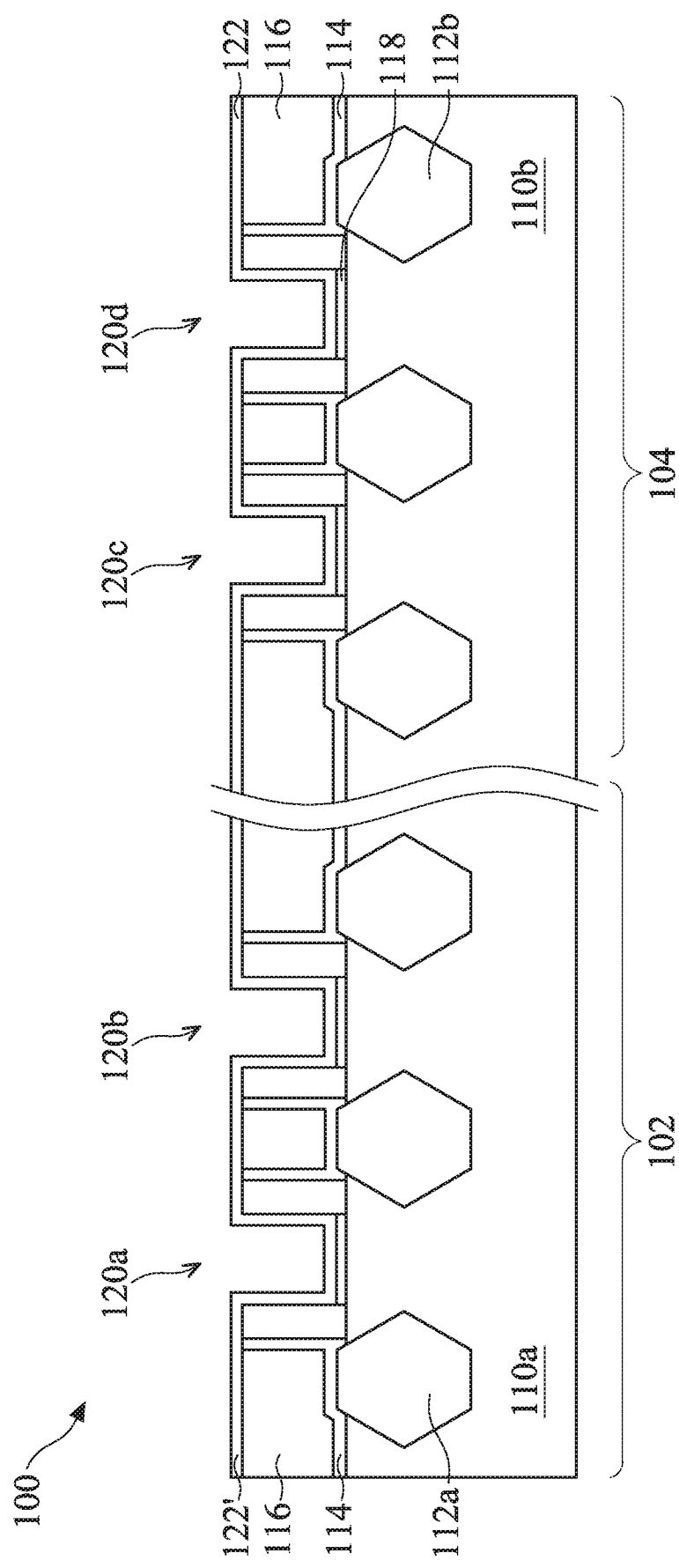

In operation 250, the first cap layer 126 and the second cap layer 128 may be removed from the device 100 from regions corresponding to the P-type FinFET structure 102, exposing the doping layer 124 as shown in FIG. 1N. The first cap layer 126 and the second cap layer 128 may be removed by an etch process. In one embodiment, operation 250 may be performed by a wet etch process. For example, the etching process may be performed by dipping, immersing, or soaking the substrate with or in an etching solution in a wet tank. The etching solution is selected to have higher etching rates for the first cap layer 126 and second cap layer 128 for the doping layer 124. The etching solution may be similar to the etch solution in operation 240.

In operation 255, an anneal process is performed on the device 100. The anneal process drives lanthanum in the doping layer 124 into the high-k dielectric layer 122, forming a lanthanum doped high-k dielectric layer 122', as shown in FIG. 1N. In some embodiments, the anneal process may be performed in a range from 800 to 850 degrees Celsius. In one embodiment, the anneal process may be performed at about 800 degrees Celsius. In some embodiments, the anneal process is performed at a chamber pressure about 1 atmosphere. In some embodiments, the anneal process is performed for a duration in a range from about 90 seconds to about 180 seconds. In one embodiment, the lanthanum doped high-k dielectric layer 122' includes lanthanum doped hafnium oxide (LaHfO).

As shown in FIG. 1N, the high-k dielectric layer 122 over the P-type FinFET structure 102 is covered by the doping layer 124. The anneal process results in the lanthanum doped high-k dielectric layer 122' over the P-type FinFET structure 102 while the high-k dielectric layer 122 (e.g., not doped with lanthanum) remains over the N-type FinFET structure 104. The dielectric constant of the doped high-k dielectric layer 122' may be designed to tune the work function of the metal gate stack in the P-type FinFET structure 102 to achieve desired performance. In one embodiment, the lanthanum doped high-k dielectric layer 122' may have a dielectric constant above 7.0.

In one embodiment, the doped high-k dielectric layer 122' includes one of $HfO_2$, HfZrO, HfSiO, SiO, HfTao, HfTiO, TiO, and $Ta_2O_5$ doped with lanthanum. In one embodiment, the high-k dielectric layer 122 includes silicon oxide and the high-k dielectric layer 122' includes silicon oxide doped with lanthanum oxide. In one embodiment, the high-k dielectric layer 122 may include hafnium oxide and the doped high-k dielectric layer 122' includes lanthanum doped hafnium oxide (LaHfO). In one embodiment, the high-k dielectric layer 122 may include hafnium oxide and the doped high-k dielectric layer 122' includes lanthanum oxide doped hafnium oxide (LaHfO)

After the annealing process in operation 255, the substrate may be treated to remove unconsumed doping layer 124, as shown FIG. 1O. Conventionally, lanthanum containing material may be removed by an etch process. Optionally, the doping layer 124 may be removed by a two-step process including a treatment process as described in operation 260 and a cleaning process as described in operation 265.

In operation 260, the substrate may be treated by an acidic solution, such as a solution of carbonic acid ($H_2CO_3$), hydrochloric acid (HCl), phosphoric acid ($H_3PO_4$), acetic acid ($CH_3COOH$), or other suitable acid solution. In some embodiments, the acidic solution is a carbonic acid ($H_2CO_3$) solution formed by dissolving carbon dioxide in deionized water. In one embodiment, the carbon dioxide deionized water may have a PH value in a range from about 5.0 to about 7.0. In one embodiment, the acidic solution may be an aqueous solution of HCl with a ratio of HCl:water in a range from about 1:5 to about 1:25. In one embodiment, the acidic solution is an aqueous solution of $H_3PO_4$ with a ratio of $H_3PO_4$:water in a range from about 1:5 to about 1:25. In another embodiment, the acidic solution is an aqueous solution of $CH_3COOH$ with a ratio of $CH_3COOH$:water in a range from about 1:5 to about 1:25.

Not to be bound by theories, the acidic solution used to treat the substrate in operation 260 is relatively a mild/weak acid solution which may soften the surface of the lanthanum residuals. The treatment of the acidic solution prevents formation of lanthanum residue on the substrate during the subsequent cleaning, such as in operation 265.

The treatment may be performed using a spin-rinse dry tool. In one embodiment, the treatment may be performed by dispensing the acid solution over a spinning substrate. In one embodiment, the treatment may be performed in a range from about 10 seconds to about 120 seconds, for example in a range from about 30 seconds to about 90 seconds. In one embodiment, the treatment may be performed for about 60 seconds.

The treatment may be performed at a temperature in a range from about 20° C. to about 80° C. In one embodiment, the treatment is performed at a temperature in a range from about 23.5° C. to about 25° C.

In operation 265, the device 100 is cleaned using a wet clean process to remove the unconsumed portion of the doping layer 124. In one embodiment, the operation 265 includes cleaning the device 100 using a halogen containing solution, such as a HF solution. In one embodiment, the HF solution may be aqueous HF solution at a concentration of 0.097%. In one embodiment, the cleaning process is performed by dispensing the HF solution over a spinning substrate. In one embodiment, the treatment is performed for a duration in a range from about 40 seconds to about 60 seconds.

In one embodiment, the operation 265 is performed immediately after the operation 260. For example, the operations 260 and 265 are performed sequentially in the same spin-rinse dry tool.

In some embodiment, the cleaning solution in operation 265 is an acid solution stronger than the acidic solution in operation 260. The stronger acidic solution in operation 265 may help remove the softened unconsumed doping layer 124 from the device 100. Thus, with a combination of weak/mild and strong acidic treatment to the substrate surface, the unconsumed doping layer 124 may be successfully removed from the device 100 without leaving undesirable residue, such as lanthanum fluoride ($LaF_3$). Because of the treatment in operation 260, undesirable residue, such as $LaF_3$ may generally not be formed over the device 100 during the cleaning process in operation 265.

Figure 1P:
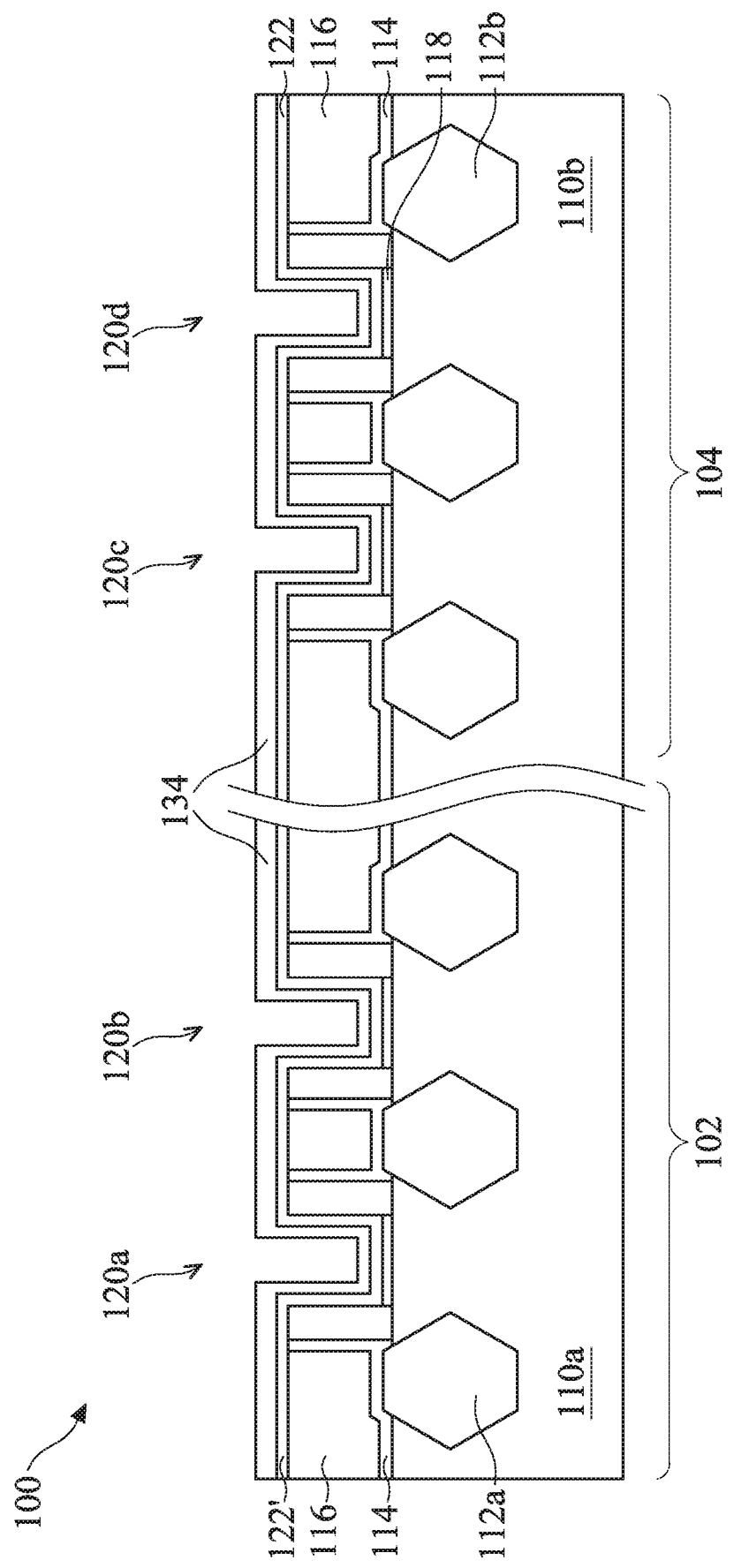

In operation 270, a work function metal layer 134 is formed over the device 100 as shown in FIG. 1P. The work function metal layer 134 may include Ti, Ag, Al, TiSiN, TiAlN, TaC, TaCN, TaSiN, Mn, Zr, TiN, TaN, Ru, Mo, Al, WN, Cu, W, any suitable materials or a combination thereof. A work function value is associated with the material composition of the work function metal layer 134. The material of the work function metal layer 134 is chosen to tune a work function value so that a desired threshold voltage (Vt) is achieved in the device that is to be formed in the respective region. The work function metal layer 134 may be deposited by CVD, ALD and/or other suitable processes so that the work function metal layer 134 provides uniform threshold voltage (Vt). In one embodiment, the work function metal layer 134 is a TiSiN layer formed by an ALD process. In one embodiment, the ALD process may be followed by an anneal process. In one embodiment, the ALD film may be annealed at a temperature about at 850° C. In one embodiment, the work function metal layer 134 has a thickness in a range from about 10 to 20 angstroms, for example, the work function metal layer 134 may have a thickness of about 13 Angstroms. The thickness of the work function metal layer 134 may be altered and adjusted by altering process parameters during the ALD deposition process, such as the deposition time, number of the pulses of precursors, pulse frequency, substrate temperature, pressure, and the like.

Even though only one layer of material is shown in work function metal layer 134 discussed in the present disclosure, the work function metal layer 134 may include a combination of multiple layers with work function to enhance device performance. For example, the work function metal layer 134 may include one or more of liner layer, wetting layer, adhesion layer, and a conductive layer of metal, metal alloy, or metal silicide.

Even though a same work function metal layer is shown to be applied in the p-type FinFET structure 102 and n-type FinFET structure 104, different work function metal layers may be applied to in the p-type FinFET structure 102 and n-type FinFET structure 104. A process including deposition, mask, etch, clean, deposition, mask, etch, and clean may be used to form different work function metal layers in the p-type FinFET structure 102 and n-type FinFET structure 104.

Traditional FinFET structures having a lanthanum doped high-k dielectric layer may have a lanthanum concentration in a range from $2.2\times10^6$ Counts-eV/s to $3.6\times10^6$ Counts-eV/s at an interface between the lanthanum doped high-k dielectric layer and a subsequent layer, such as a work function layer. In some embodiments, the p-type FinFET structure 102 manufactured with operations 260 and 265 according to the present disclosure has a lanthanum concentration below about $1.9\times10^6$ Counts-eV/s at an interface between the lanthanum doped high-k dielectric layer 122' and the work function metal layer 134.

Figure 1Q:
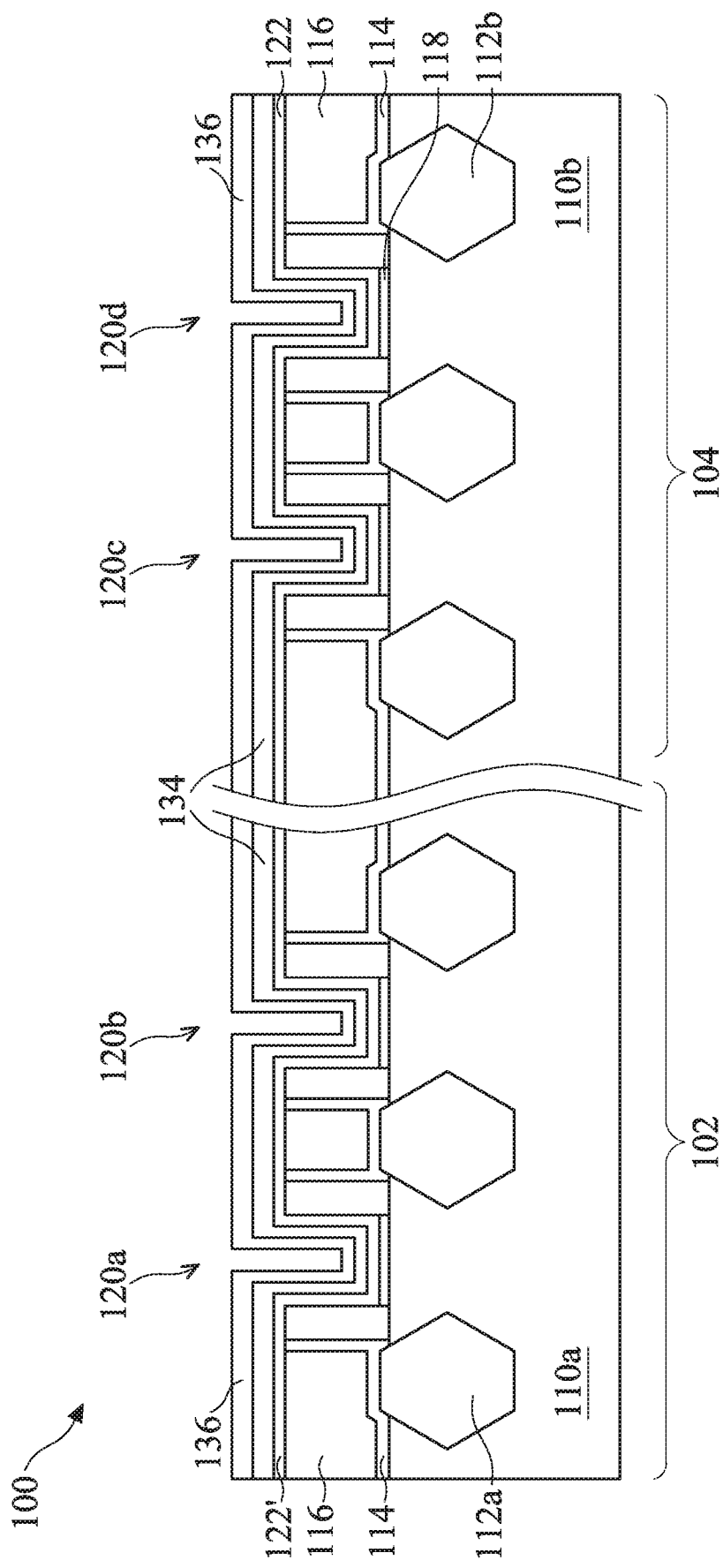

In operation 275, a cap layer 136 is formed over the work function metal layer 134, as shown in FIG. 1Q. The cap layer 136 may be a sacrificial layer configured to protect the work function metal layer 134 in subsequent processes. In one embodiment, the cap layer 136 may be a silicon layer formed by CVD. In one embodiment, the cap layer 136 may have a thickness of about 30 angstroms.

In operation 280, an anneal process may be performed on the device 100 to achieve a desirable work function value. In one embodiment, the anneal process may be performed at about 900° C.

After the anneal process in operation 280, the cap layer 136 may be removed for further processing, for example deposition of gate electrodes. In one embodiment, the removal of cap layer 136 may be removed by a dry etch process.

Figure 1R:
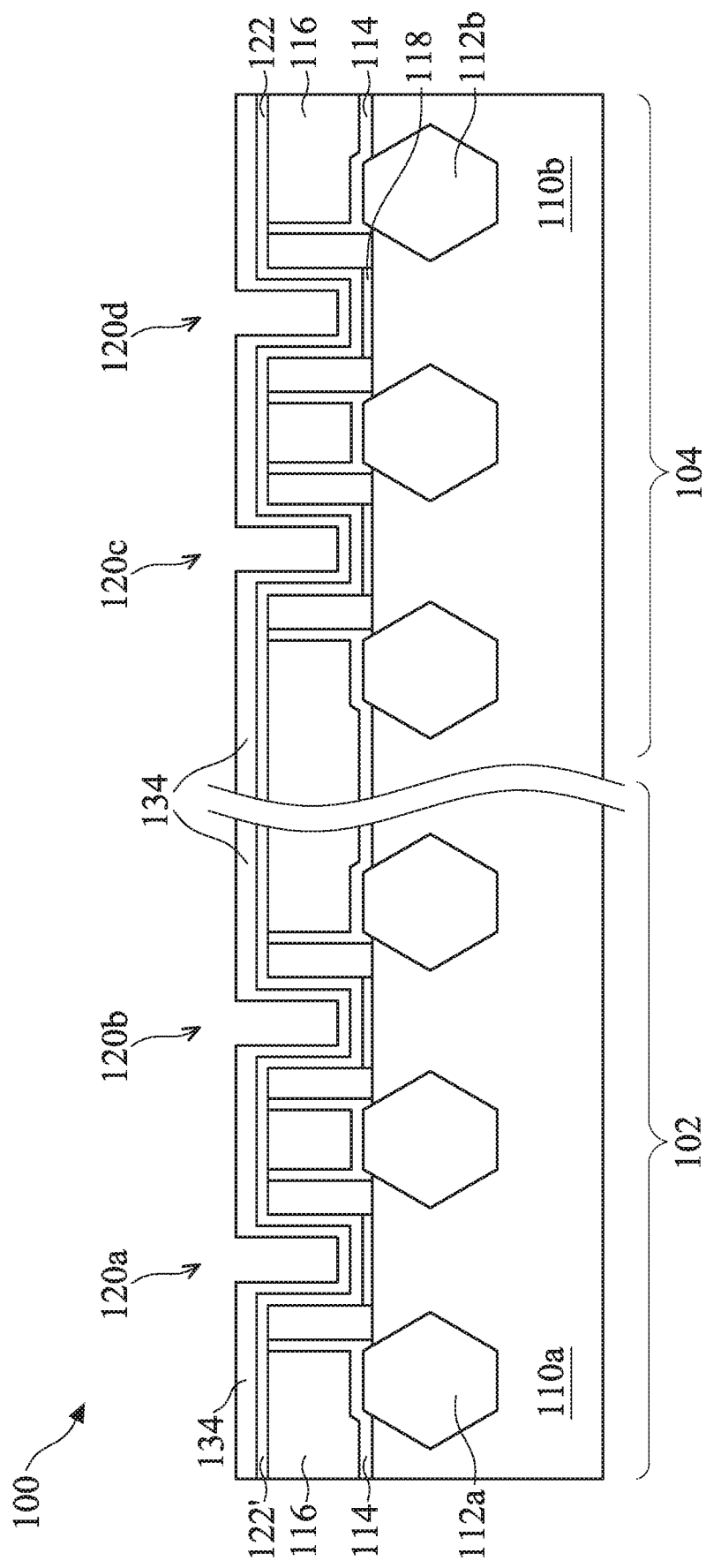

In operation 285, the cap layer 136 is removed by an etch process as shown in FIG. 1R. For example, the cap layer 136 may be removed using a plasma of etching gas. In one embodiment, the etching gas may include nitrogen trifluoride ($NF_3$) and hydrogen ($H_2$).

Not to be bound by theories, the anneal process may cause some of the lanthanum doped in the high-k dielectric layer 122' to diffuse through the work function metal layer 134. Embodiment of the present disclosure may include a cleaning process to remove any residue containing lanthanum. The process may include a treatment with an acidic solution followed by a wet cleaning process, as described in operations 290 and 295 below.

Operation 290 is similar to operation 260 described above. In operation 290, the surface of the work function metal layer 134 may be treated by an acidic solution, such as an aqueous solution of carbon-dioxide ($CO_2$), hydrochloric acid (HCl), phosphoric acid ($H_3PO_4$), acetic acid ($CH_3COOH$), or other suitable acid solution. In one embodiment, the acidic solution may be a solution of carbon dioxide in deionized water. In one embodiment, the carbon dioxide and deionized water mixture may have a PH value in a range from about 5.0 to about 7.0. In one embodiment, the acidic solution may be an aqueous solution of HCl with a ratio of HCl:water in a range from about 1:5 to about 1:25. In one embodiment, the acidic solution is an aqueous solution of $H_3PO_4$ with a ratio of $H_3PO_4$:water in a range from about 1:5 to about 1:25. In another embodiment, the acidic solution is an aqueous solution of $CH_3COOH$ with a ratio of $CH_3COOH$:water in a range from about 1:5 to about 1:25.

The treatment may be performed using a spin-rinse dry tool. In one embodiment, the treatment may be performed by dispensing the acid solution over a spinning substrate. In one embodiment, the treatment may be performed for a duration in a range from about 10 seconds to about 120 seconds, for example from about 30 seconds to about 90 seconds. In one embodiment, the treatment may be performed for about 60 seconds.

The treatment may be performed at a temperature in a range from about 20° C. to about 80° C. In one embodiment, the treatment is performed at a temperature in a range from about 23.5° C. to about 25° C.

In operation 295, the surface of the work function metal layer 134 is cleaned using a wet clean process. The wet clean process is configured to remove any lanthanum residue, such as lanthanum diffused through the work function metal layer 134 from the lanthanum doped high-k dielectric layer 122'. In one embodiment, the operation 295 includes cleaning the work function metal layer 134 using a halogen containing solution, such as a HF solution. In one embodiment, the HF solution may be aqueous HF solution at a concentration of 0.097%. In one embodiment, the cleaning process is performed by dispensing the HF solution over a spinning substrate. In one embodiment, the treatment is performed for a duration in a range from about 40 seconds to about 60 seconds.

In one embodiment, the operation 295 is performed immediately after the operation 290. For example, the operations 290 and 295 are performed sequentially in the same spin-rinse dry tool.

In some embodiments, the cleaning solution in operation 295 is an acid solution stronger than the acidic solution in operation 290. The stronger acidic solution in operation 295 may help removing the softened lanthanum from the device 100. Thus, with a combination of weak/mild and strong acidic treatment to the substrate surface, the work function metal layer 134 may be cleaned by a cleaning solution without leaving undesirable residue, such as lanthanum fluoride ($LaF_3$).

Figure 1S:
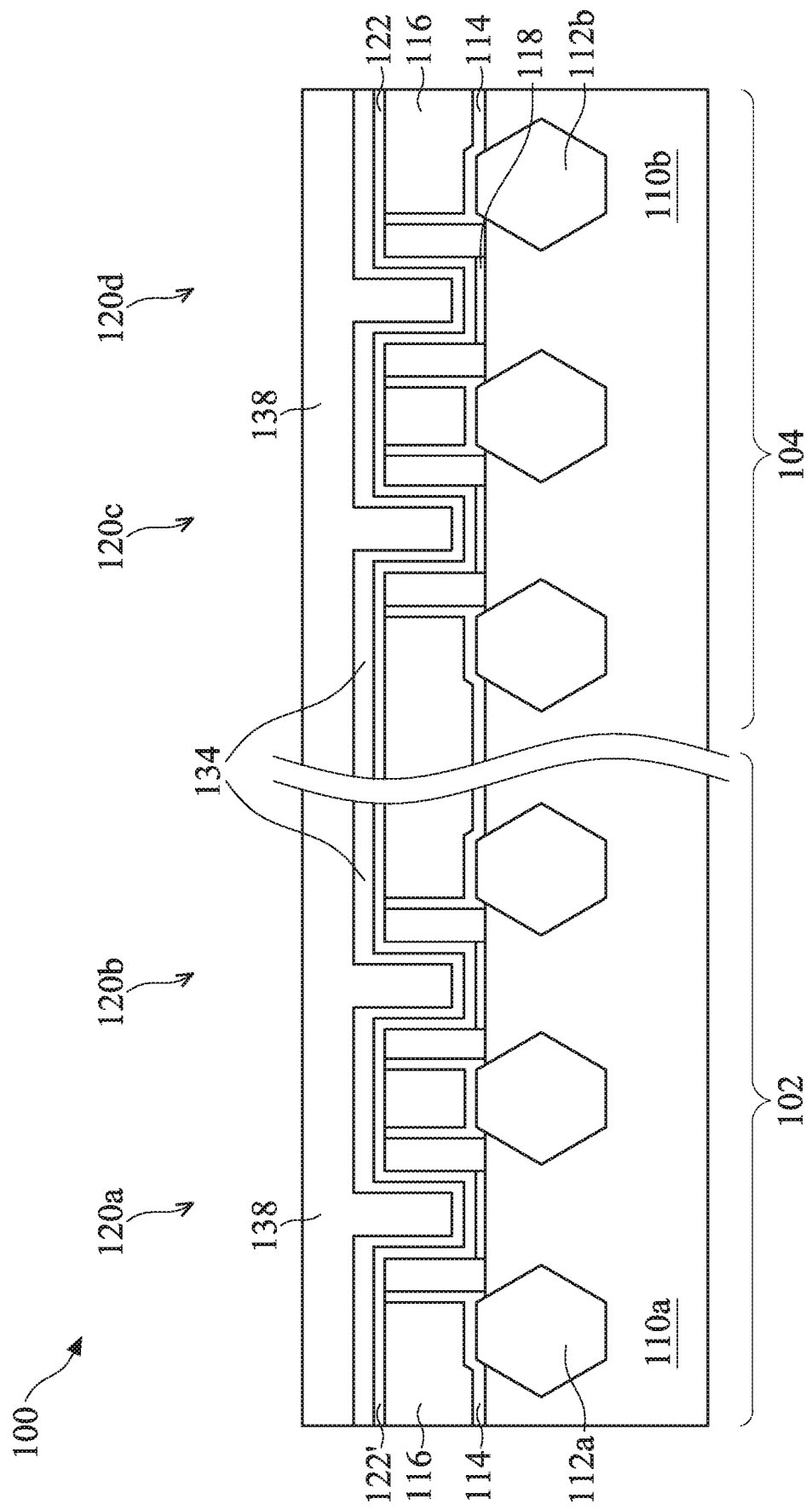
Figure 1T:
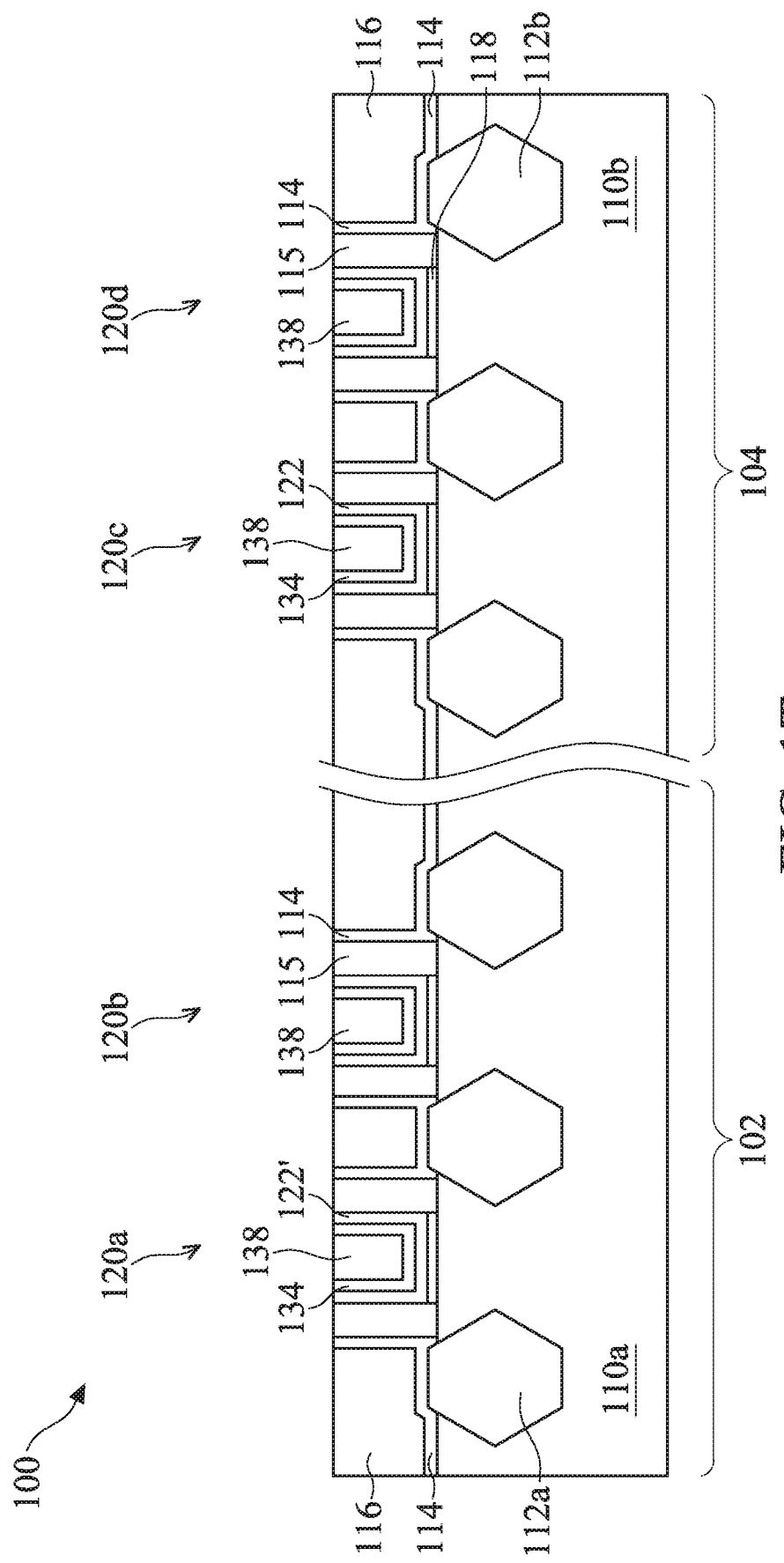
Figure 2A:
FIGS. 2A-2C are a flow chart of a method for forming a gate stack according to some embodiments of the present disclosure.
Figure 2B:
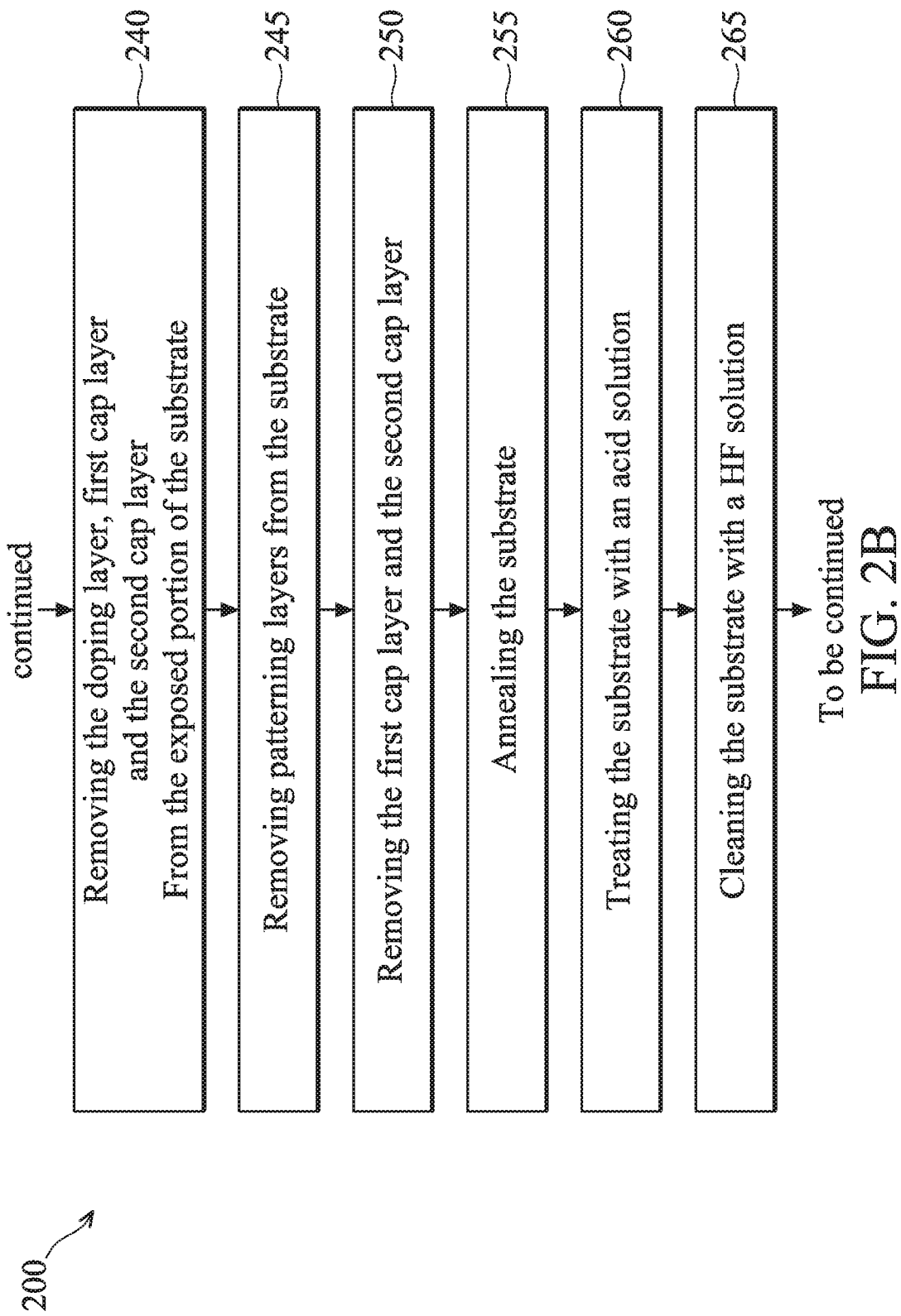
Figure 2C:
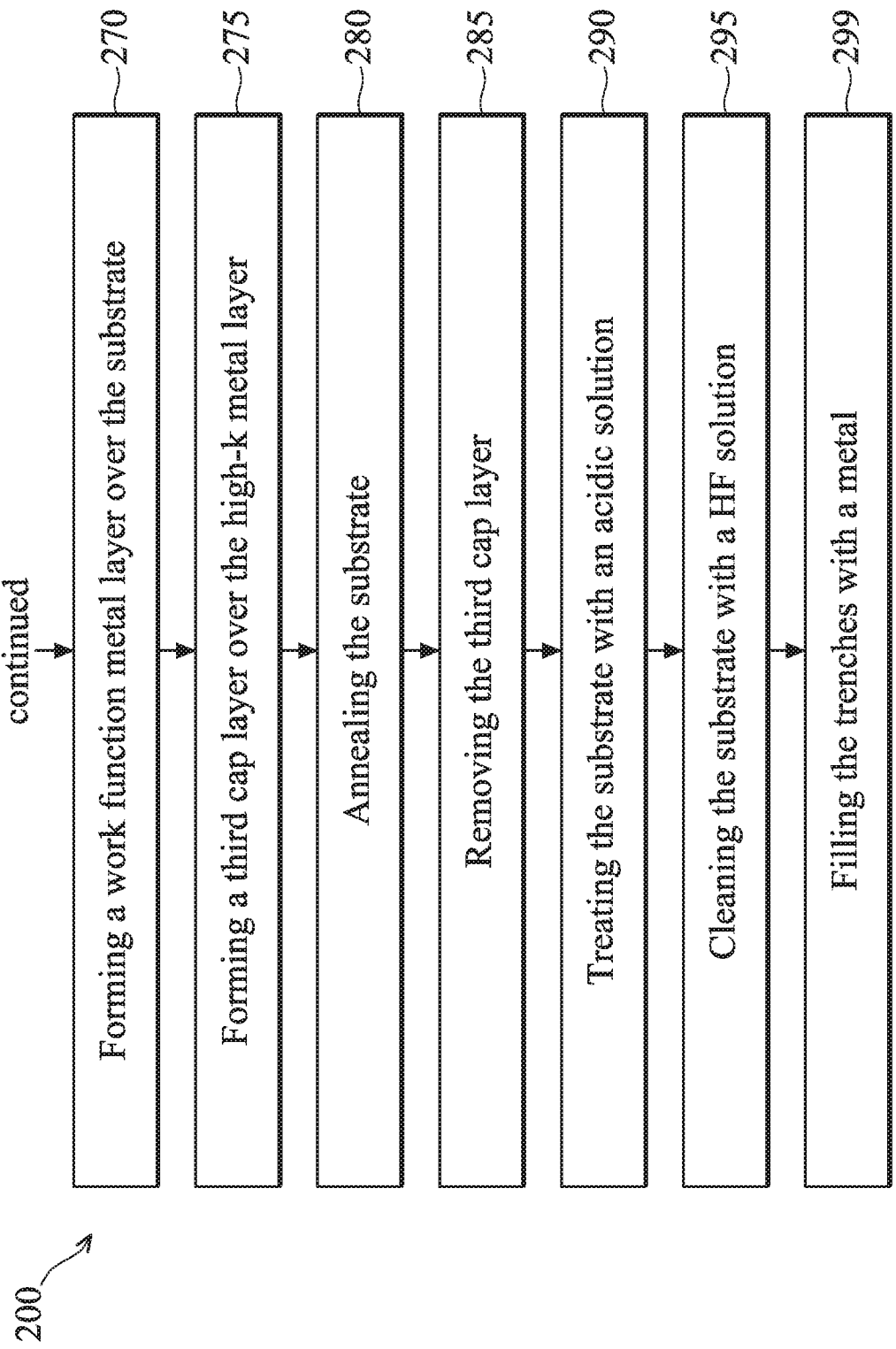

In operation 299, the trenches 120a-d may be filled with a conductive material 138 for forming gate electrodes therein as shown in FIG. 1S. The conductive material 138 may be formed by CVD, ALD, PVD, metal-organic chemical vapor deposition (MOCVD), plating, and/or other suitable processes. The conductive material may include tungsten (W), copper (Cu), aluminum (Al), or combinations thereof. A planarization process, such as a CMP process, is performed after formation of the conductive material 138 to form top surfaces of the conductive material 138 coplanar with the top surface of the interlayer dielectric layer 116, as shown in FIG. 1T.

Traditional FinFET structures having a gate electrode layer formed over a work function metal layer and a lanthanum doped high-k dielectric layer may have a lanthanum concentration above $3.6 \times 10^6$ Counts-eV/s at an interface between the work function metal layer and the gate electrode layer. In some embodiments, the p-type FinFET structure 102 manufactured with operations 290 and 295 according to the present disclosure has a lanthanum concentration below about $1.9 \times 10^6$ Counts-eV/s at an interface between the work function metal layer 134 and the conductive material 138.

Figure 3:
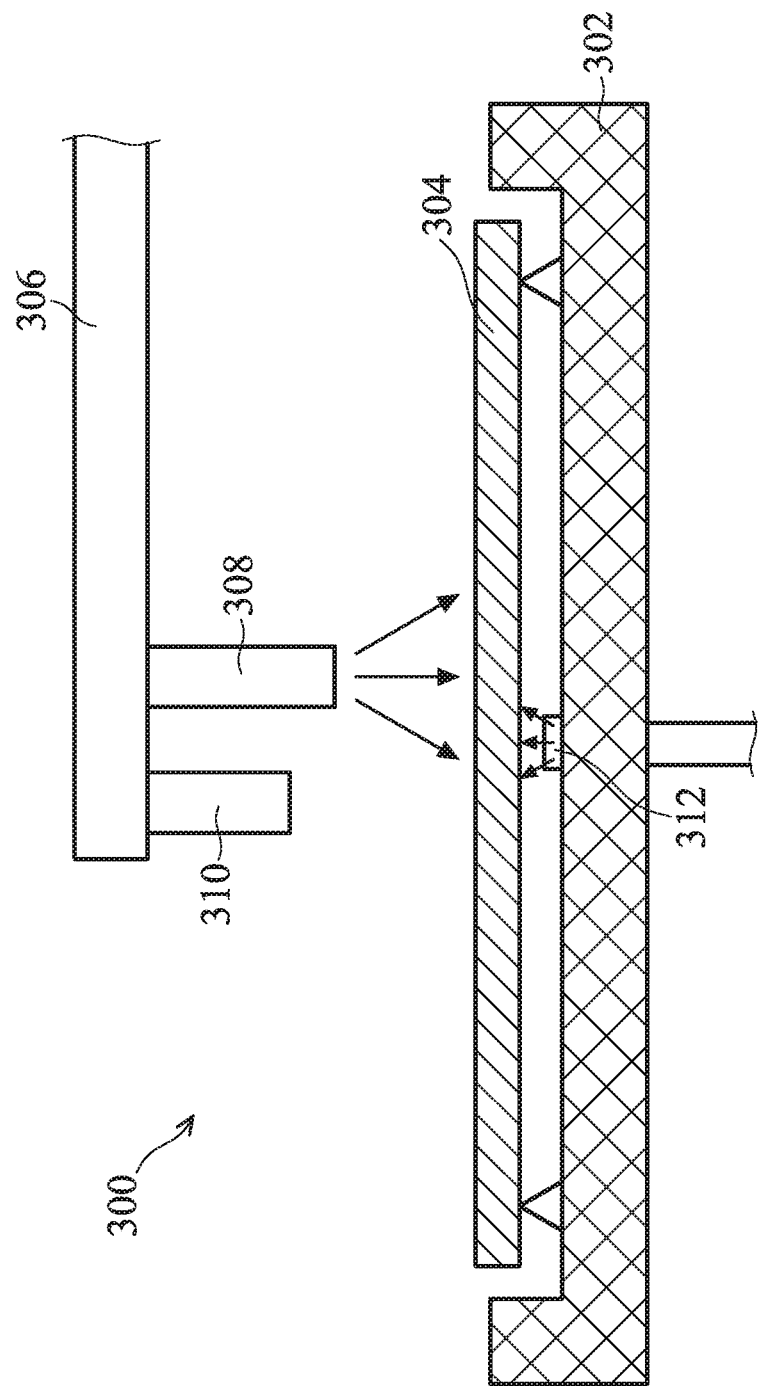
FIG. 3 is a schematic sectional view of a cleaning tool for performing a cleaning process according to some embodiments of the present disclosure.

FIG. 3 is a schematic sectional view of a cleaning tool 300 for performing a cleaning process according to embodiments of the present disclosure. The cleaning tool 300 may be used to perform operations 260/265 and operations 290/295 in the method 200.

The cleaning tool 300 may be a spin-rinse-dry tool. The cleaning tool 300 may include a substrate holder 302 for holding and spinning a substrate 304 during operation. A dispensing arm 306 may be used to dispense fluid towards a front surface of the substrate 304. The dispensing arm 306 may include a liquid dispenser 308 and a gas nozzle 310. The liquid dispenser 308 may be used to dispense the acidic solution and HF solution during operations 260/265, 290/295 or DI water during rinsing. The gas nozzle 310 may dispense air or nitrogen or inert gas to dry the substrate 304. The cleaning tool 300 may also include a back dispensing arm 312 for dispensing solutions, water, or gas towards the backside of the substrate 304.

Figure 4:
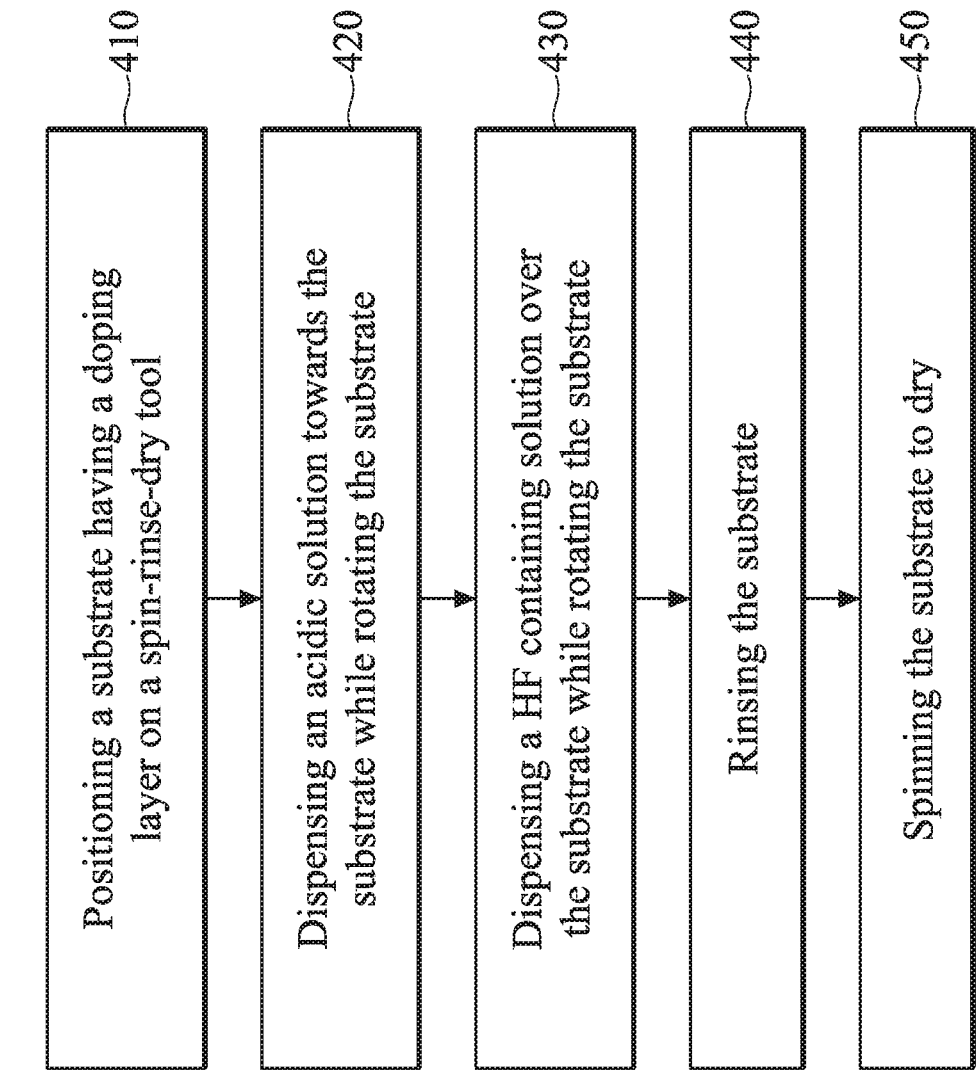
FIG. 4 is a flow chart of a method for cleaning a lanthanum containing substrate according to some embodiments of the present disclosure.

FIG. 4 includes a flow chart of a method 400 for cleaning a lanthanum containing substrate according to some embodiments of the present disclosure. The method 400 may be used to perform operations 260/265 and operations 290/295 in the method 200. The method 400 may be performed using the cleaning tool 300.

In operation 410, a substrate may be secured to a cleaning tool, such as the cleaning tool 300. The substrate may have a lanthanum containing surface. For example, the surface of the substrate may have an unconsumed lanthanum containing layer used for doping lanthanum to a layer underneath. Alternatively, the lanthanum containing surface may result from diffusion of lanthanum from a lanthanum containing layer in the substrate under the surface during process.

In operation 420, an acidic solution is dispensed to a lanthanum containing surface of the substrate while the substrate is being rotated. The acid solution is described as in operation 260 or operation 290 of the method 200. In one embodiment, the substrate may be rotated at about 800 rpm while the acidic solution is being dispensed. The acidic solution may be an aqueous solution of carbon-dioxide ($CO_2$), hydrogen chloride (HCl), phosphoric acid ($H_3PO_4$), acetic acid ($CH_3COOH$), or other suitable acid solution. In one embodiment, the acidic solution may have a PH value in a range from about 5.0 to about 7.0. In one embodiment, the treatment may be performed for a duration in a range from about 10 seconds to about 120 seconds, for example from about 30 seconds to about 90 seconds. In one embodiment, the treatment may be performed for about 60 seconds. The treatment may be performed at a temperature in a range from about 20° C. to about 80° C. In one embodiment, the treatment is performed at a temperature in a range from about 23.5° C. to about 25° C.

In operation 430, a wet clean solution, such as a HF solution, is dispensed to the lanthanum containing surface of the substrate while the substrate is being rotated. The wet cleaning solution is described as in operation 265 of the method 200. In one embodiment, the HF solution may be aqueous HF solution at a concentration of 0.097%. In one embodiment, the cleaning process is performed by dispensing the HF solution over a spinning substrate. The wet etching process may be performed at a temperature in a range from about 20° C. to about 80° C. In one embodiment, the treatment is performed for a duration in a range from about 40 seconds to about 60 seconds. In one embodiment, the substrate may be rotated at a speed of about 800 rpm in operation 430. Operation 430 may be performed immediately after operation 420 while the substrate is secured to and being rotated by the same cleaning tool.

In operation 440, the substrate is rinsed using a rinse medium. The rinse medium may be sprayed to the substrate while the substrate is being rotated. The rinse medium may be DI water, pure DI water, or DI water with $CO_2$. The rinsing operation may be performed at a temperature in a range from about 20° C. to about 80° C.

In operation 450, the substrate is dried by spinning at a rapid speed, for example at about 1200 rpm. In one embodiment, a drying gas may be dispensed towards the substrate while the substrate is being rotated. The drying gas may be nitrogen gas. Alternatively, drying may be a drying agent, such as isopropyl alcohol (IPA).

Even though the method of cleaning a lanthanum containing substrate is described above for use during gate stack formation, embodiments of the present disclosure may be used in any suitable process where a lanthanum containing substrate needs to be cleaned by a halogen containing solution, such as a HF solution. In one embodiment, the method of cleaning a substrate may be used in cleaning a substrate including a lanthanum oxide containing hardmask layer.

Some advantages of embodiments of the present disclosure include enabling lanthanum doped high-k dielectric layer in a gate stack of a FinFET device without defects caused by undesirable lanthanum residue, such as $LaF_3$. Doping lanthanum in high-k dielectric layer modulates effective work function of the gate stack, thus, improving device performance. Additionally, the cleaning process according to embodiments of the present disclosure may be performed using the same tool for the existing cleaning process, thus, improving product quality without increasing cost of ownership.

One embodiment of the present disclosure provides a method including treating a lanthanum containing surface with an acidic solution, and cleaning the treated lanthanum containing surface with a cleaning agent containing halogen.

Another embodiment of the present disclosure provides a method including forming a doping layer over a high-k dielectric layer; doping the high-k dielectric layer using the doping layer and using an anneal process; treating unconsumed doping layer with an acidic solution; and removing the unconsumed doping layer with a cleaning agent containing halogen.

Another embodiment of the present disclosure provides a semiconductor device including a field effect transistor including a gate stack, wherein the gate stack includes a lanthanum doped high-k dielectric layer, a work function layer over the lanthanum doped high-k dielectric layer, and a gate electrode over the work function layer. An interface between the lanthanum doped high-k dielectric layer and the work function layer and an interface between the work function layer and the gate electrode layer can have a lanthanum concentration less than $1.9 \times 10^6$ Counts-eV/s.

Yet another embodiment of the present disclosure provides a method including forming a high-k dielectric layer over a substrate, forming a lanthanum containing layer over the high-k dielectric layer, doping lanthanum from the lanthanum containing layer into the high-k dielectric layer, treating the substrate with an acidic solution, and cleaning the substrate with a cleaning agent containing a halogen.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
   forming a doping layer over a high-k dielectric layer;
   doping the high-k dielectric layer using the doping layer and using an anneal process, remaining portions of the doping layer forming an unconsumed doping layer;
   treating, in a first process, the unconsumed doping layer with an acidic solution; and
   after the first process, removing, in a second process, the unconsumed doping layer with a cleaning agent containing halogen, wherein the first process is a different process than the second process.

2. The method of claim 1, wherein the acidic solution comprises a solution of $CO_2$ dissolved in deionized water.

3. The method of claim 1, wherein the acidic solution is a solution comprising at least one of HCl, $H_3PO_4$, $CH_3COOH$, $H_2CO_3$, or a combination thereof.

4. The method of claim 3, wherein treating the unconsumed doping layer is performed at a temperature in a range from 20° C. to 80° C.

5. The method of claim 1, wherein the acidic solution is an aqueous solution of $CH_3COOH$ with a ratio of $CH_3COOH$:water in a range from 1:5 to 1:25.

6. The method of claim 1, wherein the acidic solution is an aqueous solution of HCl with a ratio of HCl:water in a range from 1:5 to 1:25, or an aqueous solution of $H_3PO_4$ with a ratio of $H_3PO_4$:water in a range from 1:5 to 1:25.

7. The method of claim 1, further comprising annealing the high-k dielectric layer and the doping layer at a temperature in a range from about 800 to about 850 degrees Celsius.

8. The method of claim 1, wherein the doping layer is a lanthanum containing layer for doping the high-k dielectric layer with lanthanum.

9. A method comprising:
   forming a high-k dielectric layer over a substrate;
   forming a lanthanum containing layer over the high-k dielectric layer;
   doping lanthanum from the lanthanum containing layer into the high-k dielectric layer to form a lanthanum doped high-k dielectric layer;
   treating excess lanthanum containing material with an acidic solution to form a treated lanthanum containing material, wherein a thickness of the lanthanum containing material prior to treating has a substantially same thickness as the treated lanthanum containing material; and
   after treating the excess lanthanum containing material, cleaning the substrate with a cleaning agent containing a halogen, the cleaning removing the treated lanthanum containing material, wherein the cleaning and the treating are different processes.

10. The method of claim 9, wherein treating the excess lanthanum containing material with the acidic solution and cleaning the substrate with the cleaning agent remove unconsumed portions of the lanthanum containing layer from the substrate.

11. The method of claim 10, wherein doping lanthanum into the high-k dielectric layer comprises:
    forming a first cap layer over the lanthanum containing layer;
    forming a second cap layer over the first cap layer;
    annealing the substrate to dope lanthanum into the high-k dielectric layer to form a lanthanum doped high-k dielectric layer, wherein after annealing remaining portions of the lanthanum containing layer form the excess lanthanum containing material; and
    removing the first and second cap layers to expose the excess lanthanum containing material,
    wherein treating the excess lanthanum containing material with the acidic solution and cleaning the substrate with the cleaning agent are performed after removing the first and second cap layers to remove the excess lanthanum containing material from the substrate.

12. The method of claim 9, further comprising:
    after doping lanthanum into the high-k dielectric layer, forming a work function layer over the lanthanum doped high-k dielectric layer;
    annealing the work function layer; and
    performing another treating with the acidic solution and another cleaning with the cleaning agent to remove lanthanum diffused to a surface of the work function layer.

13. The method of claim 12, further comprising:
    forming a cap layer over the work function layer prior to annealing; and
    removing the cap layer after annealing,
    wherein the another treating with the acidic solution and the another cleaning with the cleaning agent are performed after removing the cap layer to remove lanthanum diffused to the surface of the work function layer.

14. The method of claim 9, the acidic solution comprises a solution of carbon dioxide dissolved in deionized water, and the acidic solution has a PH value in a range from 5.0 to 7.0.

15. The method of claim 9, wherein the acidic solution is an aqueous solution selected from the group consisting of:
an aqueous solution of HCl with a ratio of HCl:water in a range from 1:5 to 1:25;
an aqueous solution of $H_3PO_4$ with a ratio of $H_3PO_4$:water in a range from 1:5 to 1:25; and
an aqueous solution of $CH_3COOH$ with a ratio of $CH_3COOH$:water in a range from 1:5 to 1:25.

16. A method comprising:
forming an interfacial layer over a channel region in a substrate;
forming a high-k dielectric layer on the interfacial layer;
forming a doping layer over the high-k dielectric layer, wherein the doping layer comprises lanthanum;
annealing the substrate, wherein annealing drives lanthanum from the doping layer into the high-k dielectric layer to form a treated high-k dielectric layer, wherein remaining portions of the doping layer remains after annealing the substrate;
exposing the remaining portions of the doping layer to an acidic solution to form treated portions of the doping layer;
removing the treated portions of the doping layer using a halogen-containing solution, wherein the exposing and the removing comprise different processes, wherein a majority of the treated portions of the doping layer is removed during the removing; and
forming a gate electrode over the treated high-k dielectric layer.

17. The method of claim 16, wherein exposing the remaining portions is performed at a temperature in a range from about 20° C. to about 80° C.

18. The method of claim 16, wherein the treated high-k dielectric layer comprises $HfO_2$, HfZrO, HfSiO, SiO, HMO, HMO, TiO, or $Ta_2O_5$ doped with lanthanum.

19. The method of claim 16 further comprising:
prior to annealing, forming one or more cap layers over the doping layer; and
prior to removing treated portions of the doping layer, removing the one or more cap layers.

20. The method of claim 16, wherein the acidic solution is a solution comprising at least one of HCl, $H_3PO_4$, $CH_3COOH$, $H_2CO_3$, or a combination thereof.

* * * * *

UNITED STATES PATENT AND TRADEMARK OFFICE
CERTIFICATE OF CORRECTION

PATENT NO. : 10,720,516 B2
APPLICATION NO. : 15/991761
DATED : July 21, 2020
INVENTOR(S) : Ming-Chi Huang et al.

Page 1 of 1

It is certified that error appears in the above-identified patent and that said Letters Patent is hereby corrected as shown below:

In the Claims

In Column 18, Lines 14-15, Claim 18, delete "HMO, HMO" and insert --HfTaO, HfTiO--.

Signed and Sealed this
Thirteenth Day of October, 2020

Andrei Iancu
*Director of the United States Patent and Trademark Office*